US010410976B2

(12) United States Patent
Asano et al.

(10) Patent No.: US 10,410,976 B2
(45) Date of Patent: Sep. 10, 2019

(54) METHOD OF MANUFACTURING SEMICONDUCTOR CHIP, SEMICONDUCTOR CHIP, AND SEMICONDUCTOR DEVICE

(71) Applicant: KABUSHIKI KAISHA TOSHIBA, Minato-ku (JP)

(72) Inventors: Yusaku Asano, Yokohama (JP); Kazuhito Higuchi, Yokohama (JP); Taizo Tomioka, Yokohama (JP); Tomohiro Iguchi, Kawasaki (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 37 days.

(21) Appl. No.: 15/240,625

(22) Filed: Aug. 18, 2016

(65) Prior Publication Data

US 2016/0358863 A1    Dec. 8, 2016

Related U.S. Application Data

(62) Division of application No. 14/540,360, filed on Nov. 13, 2014, now Pat. No. 9,460,967.

(30) Foreign Application Priority Data

Nov. 13, 2013  (JP) ................................ 2013-235470
Oct. 27, 2014  (JP) ................................ 2014-218512

(51) Int. Cl.
*H01L 21/78*      (2006.01)
*H01L 23/00*      (2006.01)
(Continued)

(52) U.S. Cl.
CPC .......... *H01L 23/562* (2013.01); *H01L 21/308* (2013.01); *H01L 21/3081* (2013.01);
(Continued)

(58) Field of Classification Search
CPC ................. H01L 21/78; H01L 21/3081; H01L 21/30604; H01L 23/2121; H01L 23/3192;
(Continued)

(56) References Cited

U.S. PATENT DOCUMENTS 6,762,134 B2    7/2004  Bohn et al.
6,790,785 B1    9/2004  Li et al.
(Continued)

FOREIGN PATENT DOCUMENTS

CN       1674241 A    9/2005
CN     101005021 A    7/2007
(Continued)

OTHER PUBLICATIONS

Office Action dated Oct. 20, 2016 in Korean Patent Application No. 10-2014-0155382.
(Continued)

*Primary Examiner* — Thinh T Nguyen
(74) *Attorney, Agent, or Firm* — Oblon, McClelland, Maier & Neustadt, L.L.P.

(57) ABSTRACT

A method of manufacturing a semiconductor chip according to an embodiment includes forming on a semiconductor substrate a plurality of etching masks each including a protection film to demarcate a plurality of first regions of the substrate protected by the plurality of etching masks and a second region as an exposed region of the substrate, and anisotropically removing the second region by a chemical etching process to form a plurality of grooves each including a side wall at least partially located in the same plane as an end face of the etching mask and a bottom portion reaching a back surface of the substrate, thereby singulating the semiconductor substrate into a plurality of chip main bodies corresponding to the plurality of first regions.

9 Claims, 22 Drawing Sheets

(51) Int. Cl.
  *H01L 21/308* (2006.01)
  *H01L 21/306* (2006.01)
  *H01L 23/31* (2006.01)
  *H01L 23/544* (2006.01)

(52) U.S. Cl.
  CPC ........ *H01L 21/30604* (2013.01); *H01L 21/78* (2013.01); *H01L 23/3121* (2013.01); *H01L 23/3192* (2013.01); *H01L 23/544* (2013.01); H01L 2223/5448 (2013.01); H01L 2224/32245 (2013.01); H01L 2224/48091 (2013.01); H01L 2224/48247 (2013.01); H01L 2224/73265 (2013.01); H01L 2924/181 (2013.01)

(58) Field of Classification Search
  CPC ........... H01L 23/562; H01L 2223/5448; H01L 2224/48247; H01L 2224/48091; H01L 2224/73265; H01L 2924/00014
  USPC ......... 257/618, 620, 622, E21.599; 438/113, 438/460, 728
  See application file for complete search history.

(56) References Cited

U.S. PATENT DOCUMENTS

| | | | |
|---|---|---|---|
| 7,871,902 B2 | 1/2011 | Kaltalioglu | |
| 8,278,191 B2* | 10/2012 | Hildreth | B81C 1/00071 438/460 |
| 8,486,843 B2 | 7/2013 | Li et al. | |
| 2008/0012096 A1* | 1/2008 | Sin | H01L 21/78 257/620 |
| 2009/0127588 A1* | 5/2009 | Sirringhaus | H01L 21/0271 257/213 |
| 2010/0120227 A1* | 5/2010 | Grivna | H01L 21/78 438/462 |
| 2010/0230822 A1* | 9/2010 | Pagaila | H01L 21/565 257/773 |
| 2010/0248449 A1* | 9/2010 | Hildreth | B81C 1/00071 438/460 |
| 2012/0088372 A1* | 4/2012 | Chien | H01L 21/0203 438/753 |
| 2012/0187574 A1* | 7/2012 | Sasaki | H01L 25/18 257/777 |
| 2012/0238073 A1* | 9/2012 | Johnson | H01L 21/3065 438/464 |
| 2013/0029445 A1 | 1/2013 | Kim et al. | |
| 2013/0344683 A1 | 12/2013 | Lazerand | |
| 2014/0211501 A1* | 7/2014 | Tseng | G02B 6/0016 362/608 |
| 2014/0284754 A1* | 9/2014 | Yamamoto | H01L 23/49551 257/487 |
| 2014/0376261 A1* | 12/2014 | Liu | G02B 6/0031 362/609 |

FOREIGN PATENT DOCUMENTS

| | | |
|---|---|---|
| CN | 101026125 A | 8/2007 |
| CN | 101107703 A | 1/2008 |
| CN | 103227259 A | 7/2013 |
| JP | 2004-103738 A | 4/2004 |
| JP | 2004-304081 A | 10/2004 |
| JP | 2007-7827 A | 1/2007 |
| JP | 2007-19375 A | 1/2007 |
| JP | 2007-281526 A | 10/2007 |
| JP | 2011-60846 A | 3/2011 |
| JP | 2011-101009 | 5/2011 |
| JP | 2013-527103 | 6/2013 |
| TW | 201126648 | 8/2011 |
| TW | 201216347 | 4/2012 |
| TW | 201306301 | 2/2013 |

OTHER PUBLICATIONS

Office Action dated Oct. 23, 2015, in Taiwanese Patent Application No. 103138234 (w/English-language Translation).
Office Action dated Mar. 3, 2016, in Taiwanese Patent Application No. 103138234 (w/English-language Translation).
Office Action dated Mar. 10, 2016 in Korean Patent Application No. 10-2014-0155382 (with English language translation).
Office Action dated Oct. 4, 2016 in Japanese Patent Application No. 2014-218512 (with English translation).
Combined Office Action and Search Report dated Jan. 26, 2017 in Chinese Patent Application No. 201410640037.0 with English translation of categories of cited documents.

* cited by examiner

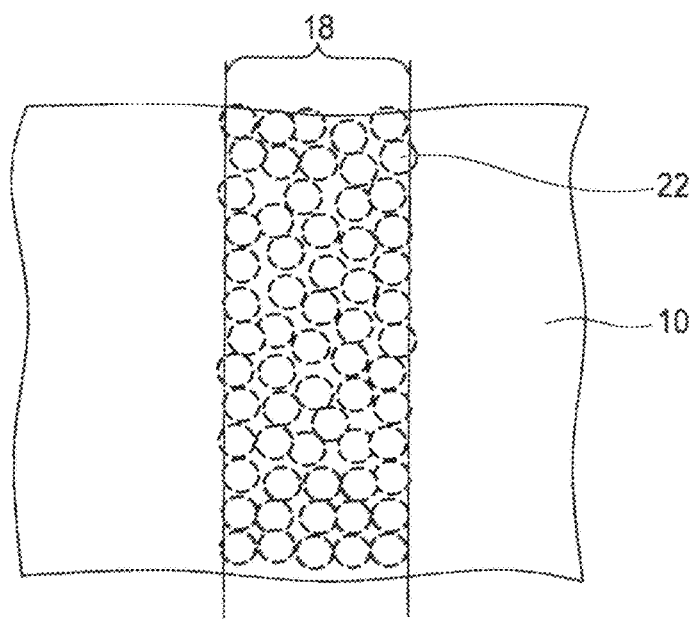
F I G. 6
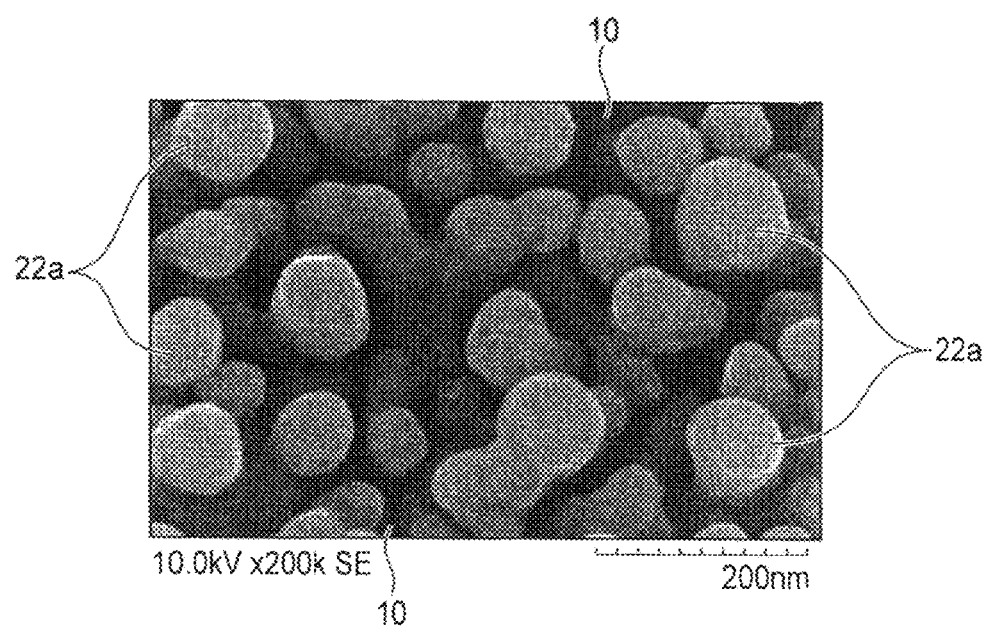
F I G. 7

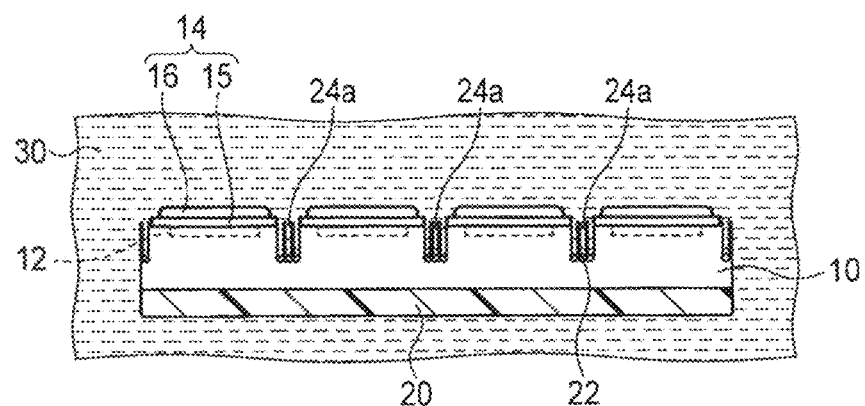
F I G. 9
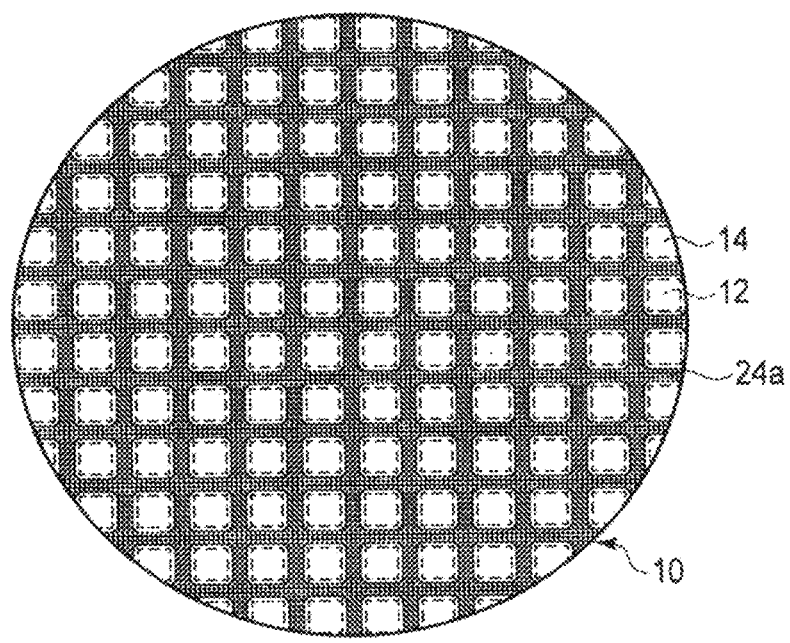
F I G. 10

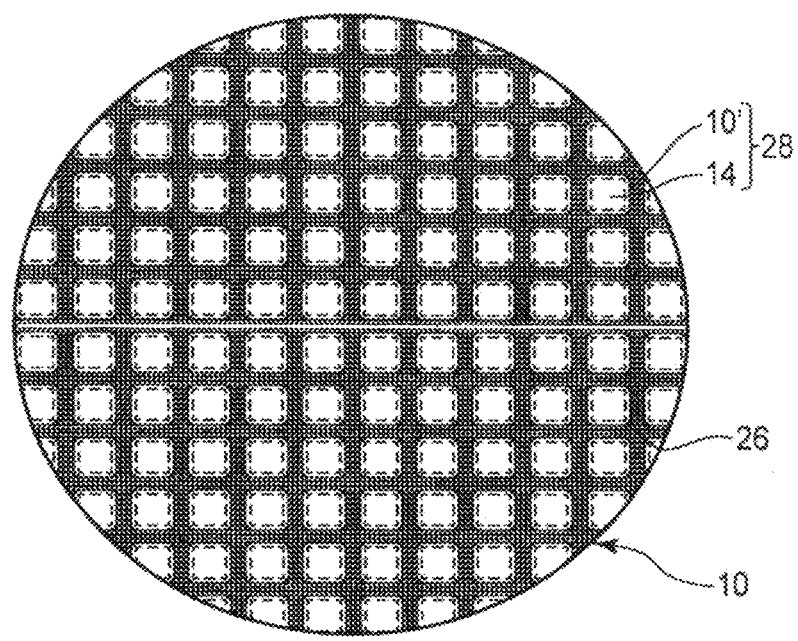
F I G. 13
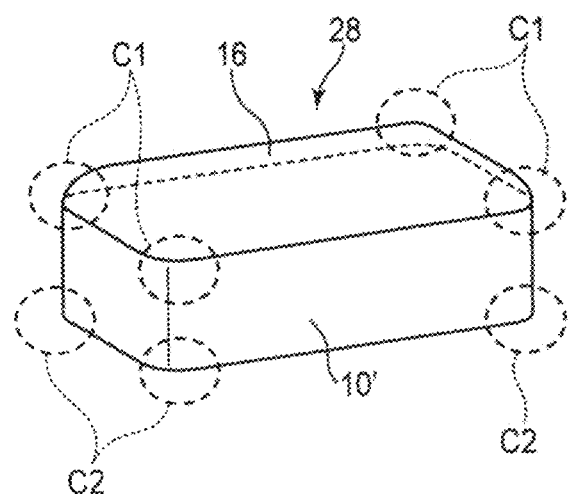
F I G. 14

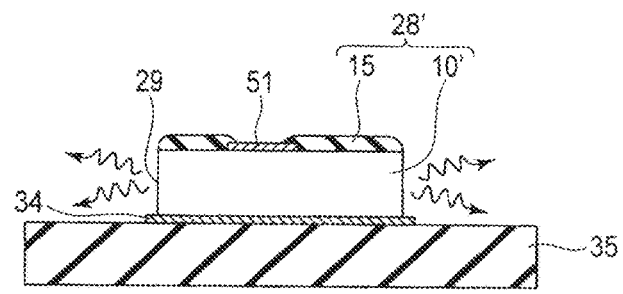
F I G. 18
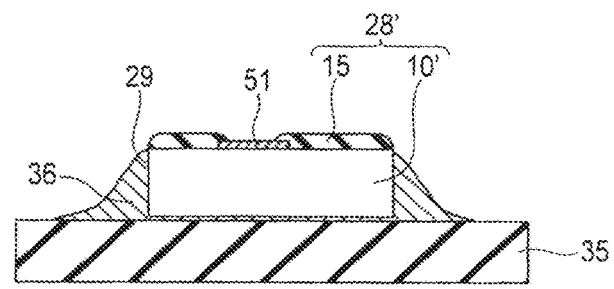
F I G. 19
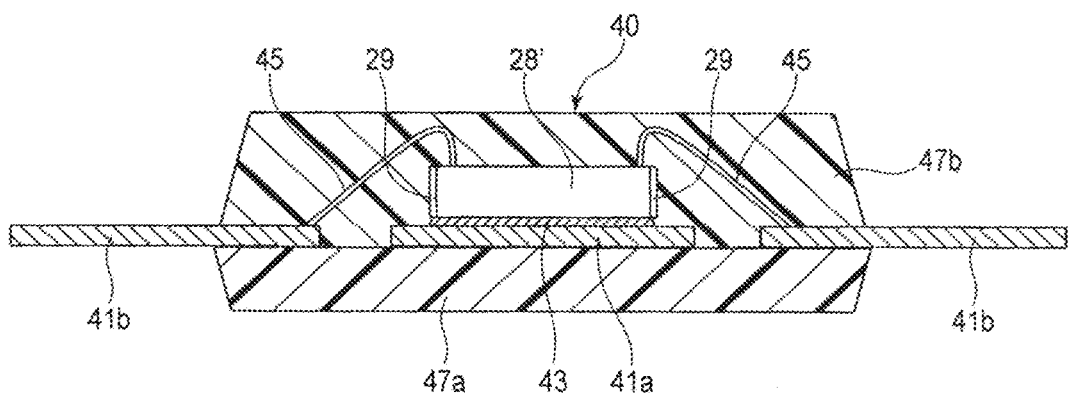
F I G. 20

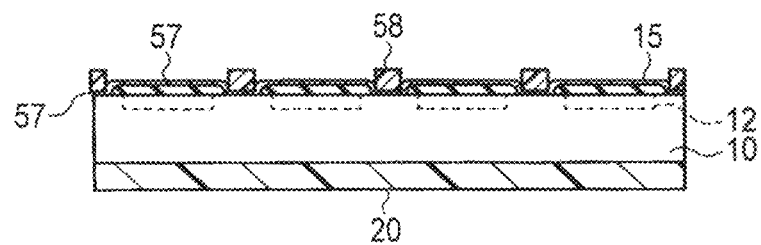
F I G. 26A
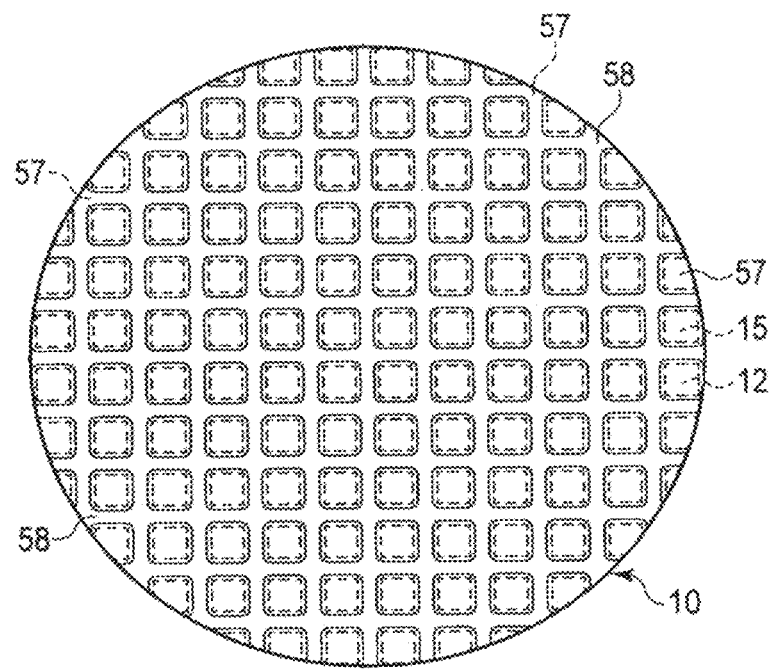
F I G. 26B

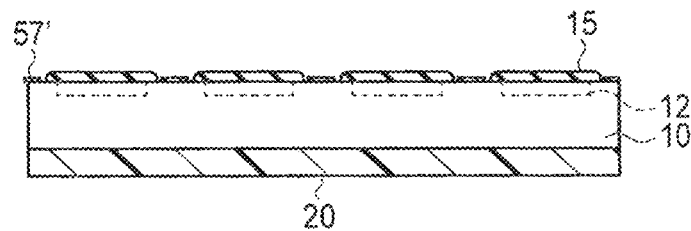
F I G. 28A
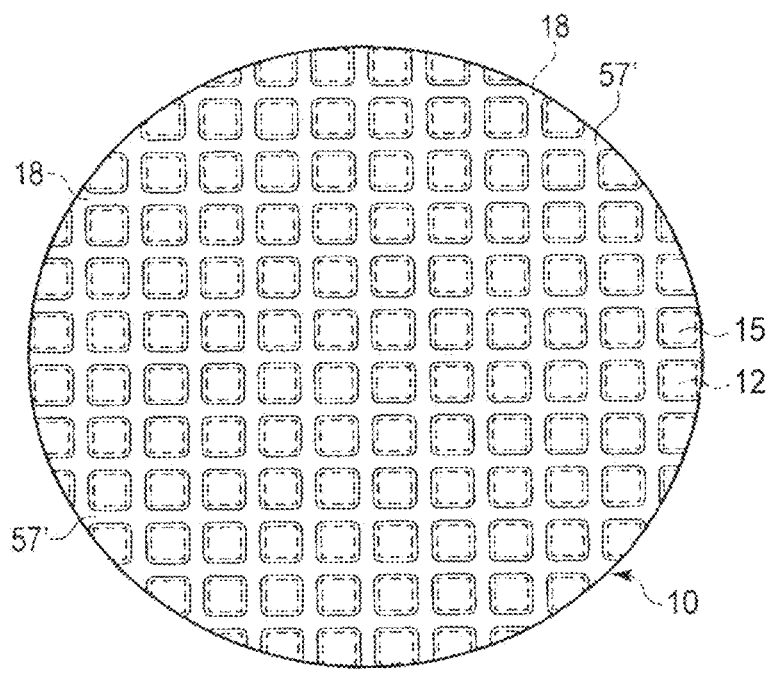
F I G. 28B

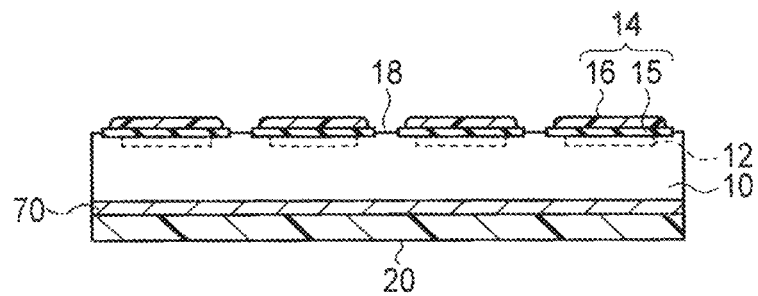
F I G. 30
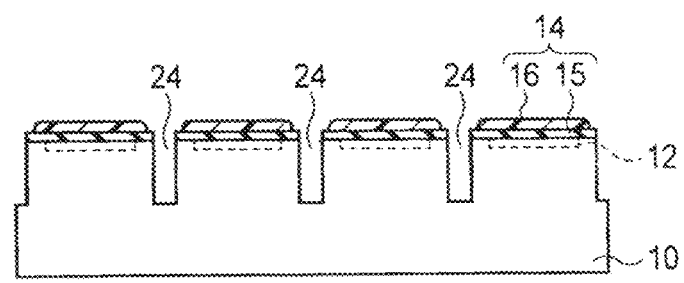
F I G. 31A
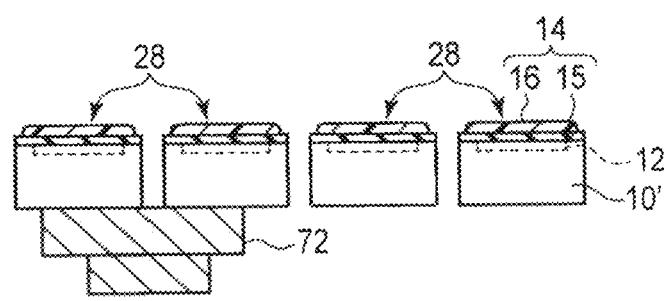
F I G. 31B

METHOD OF MANUFACTURING SEMICONDUCTOR CHIP, SEMICONDUCTOR CHIP, AND SEMICONDUCTOR DEVICE

CROSS-REFERENCE TO RELATED APPLICATIONS

This application is a divisional of U.S. application Ser. No. 14/540,360, filed on Nov. 13, 2014, and is based upon and claims the benefit of priority from Japanese Patent Applications No. 2013-235470, filed Nov. 13, 2013; and No. 2014-218512, filed Oct. 27, 2014, the entire contents of each of which are incorporated herein by reference.

FIELD

Embodiments described herein relate generally to a method of manufacturing a semiconductor chip, a semiconductor chip, and a semiconductor device.

BACKGROUND

Blade dicing, which mechanically cuts a wafer by a rotating blade, is generally used for singulation of a semiconductor substrate into chips. In the blade dicing, a plurality of dicing grooves are successively formed on the semiconductor substrate so as to singulate the semiconductor substrate into chips. Thus, in the blade dicing, if the chip size is reduced and the number of dicing grooves (the number of lines) is increased, there arises such a problem that the dicing time becomes longer in proportion to the number of lines.

In addition, a chip obtained by blade dicing has right-angled corner portions, and has a low shock resistance. Furthermore, in the blade dicing, since fine cracking (chipping) occurs at an end portion of the chip, the chip obtained by blade dicing has a low flexural strength.

Incidentally, in recent years, it has been proposed to form a deep hole with a high aspect ratio in a single-crystal substrate by a chemical action.

BRIEF DESCRIPTION OF THE DRAWINGS

FIG. 6 is a view illustrating a precious metal catalyst disposed on an exposed region;

FIG. 7 is a scanning electron microscope (SEM) photograph of an Ag nanoparticle catalyst;

FIG. 9 is a cross-sectional view illustrating a fabrication step following the fabrication step of FIG. 4;

FIG. 10 is a top view of the semiconductor substrate in which deep trenches are formed;

FIG. 13 is a top view of the semiconductor substrate on which needle-like residues occurred;

FIG. 14 is a perspective view illustrating an example of a singulated semiconductor chip;

FIG. 18 is a cross-sectional view of a semiconductor device according to an embodiment;

FIG. 19 is a cross-sectional view of a semiconductor device according to another embodiment;

FIG. 20 is a cross-sectional view of a semiconductor device according to still another embodiment;

FIG. 26A is a cross-sectional view illustrating a fabrication step following the fabrication step of FIG. 25A;

FIG. 26B is a top view illustrating the fabrication step of FIG. 26A;

FIG. 28A is a cross-sectional view illustrating a fabrication step following the fabrication step of FIG. 27A;

FIG. 28B is a top view illustrating the fabrication step of FIG. 28A;

FIG. 30 is a cross-sectional view illustrating another example of the semiconductor substrate;

FIG. 31A is a cross-sectional view illustrating a fabrication step of a method according to another embodiment; and FIG. 31B is a cross-sectional view illustrating a fabrication step following the fabrication step of FIG. 31B.

DETAILED DESCRIPTION

A method of manufacturing a semiconductor chip according to an embodiment includes forming on a semiconductor substrate a plurality of etching masks each including a protection film to demarcate a plurality of first regions of the semiconductor substrate protected by the plurality of etching masks and a second region as an exposed region of the semiconductor substrate, and anisotropically removing the second region by a chemical etching process to form a plurality of grooves each including a side wall at least partially located in the same plane as an end face of the etching mask and a bottom portion reaching a back surface of the semiconductor substrate, thereby singulating the semiconductor substrate into a plurality of chip main bodies corresponding to the plurality of first regions.

Various embodiments will be described below with reference to the accompanying drawings.

Figure 1:
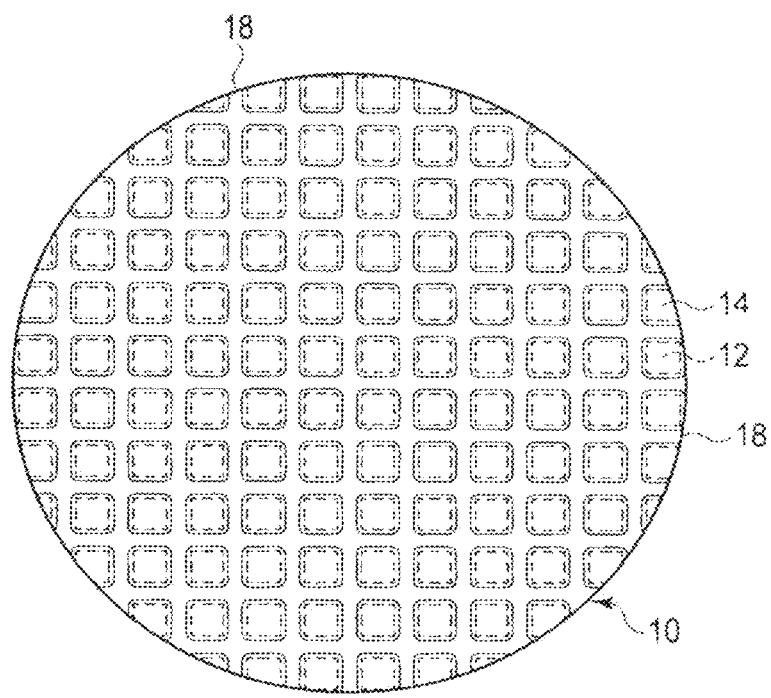
FIG. 1 is a top view of a semiconductor substrate on which etching masks are formed.
Figure 2:
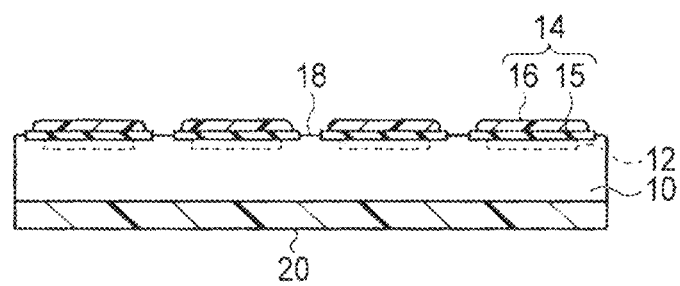
FIG. 2 is a cross-sectional view illustrating a part of the semiconductor substrate shown in FIG. 1.

FIG. 1 is a top view of a semiconductor substrate which is used in a method according to an embodiment. FIG. 2 is a partial cross-sectional view of the semiconductor substrate of FIG. 1.

As illustrated, a plurality of element regions 12 each including one or more semiconductor elements are provided on a semiconductor substrate 10. These element regions 12 are arranged such that they are spaced apart from each other. Each element region 12 is protected by being covered with an etching mask 14.

The semiconductor element included in the element region 12 is, for example, a transistor, a diode, a light-emitting diode, or a semiconductor laser. The element region 12 may further include a capacitor, wiring, etc.

A region between neighboring element regions 12 is an exposed region 18 at which a surface of the semiconductor substrate 10 is exposed. As will be described later, a precious metal catalyst is disposed on this exposed region 18. In this embodiment, singulated semiconductor chips are obtained by removing the exposed region 18 of the semiconductor substrate 10 by performing a chemical etching process using a precious metal catalyst and an etching liquid.

In the example illustrated in FIG. 2, the etching mask 14 has a multilayered structure of an insulation film 15 and a protection film 16. The insulation film can be said to be a kind of protection film. Providing the insulation film 15 enables to surely protect an electrode pad (not shown) of the element region 12. Depending on cases, the etching mask 14 may be composed of either the insulation film or the protection film.

It is preferable that a dicing sheet 20 for holding singulated chips is attached on a back surface of the semiconductor substrate 10.

The semiconductor substrate 10 can be composed of a material that can be selectively etched by the effect of a precious metal catalyst, for example, a material selected from Si, Ge, a III-V semiconductor, that is, a semiconductor (e.g. GaAs, GaN) made of a compound of a group III element and a group V element, SiC, etc. Incidentally, the term "group" used in this context is the "group" of the short-form periodic table.

The thickness of the semiconductor substrate 10 is not particularly limited, and may be properly chosen in accordance with the size of semiconductor chips which are to be obtained. The thickness of the semiconductor substrate 10 can be set in a range of, e.g. 50 μm to 500 μm. Similarly, the dosage of impurities in the semiconductor substrate 10 is not particularly limited, and may be properly chosen. The major surface of the semiconductor substrate 10 may be parallel to any one of crystal planes of a semiconductor.

The etching masks 14 are selectively formed on a plurality of regions of the top surface of the semiconductor substrate 10 so as to cover the element regions 12. The top-surface shape of each etching mask 14 is not limited to a rectangular shape, and may be various shapes as illustrated in FIG. 3A to FIG. 3E.

Figure 3A:
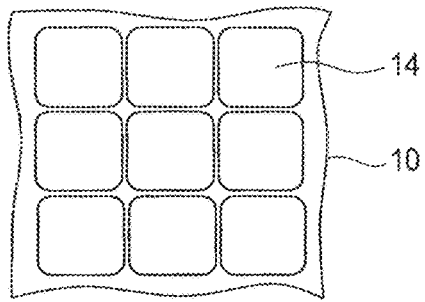
FIG. 3A is a plan view illustrating an example of the shapes of etching masks.
Figure 3B:
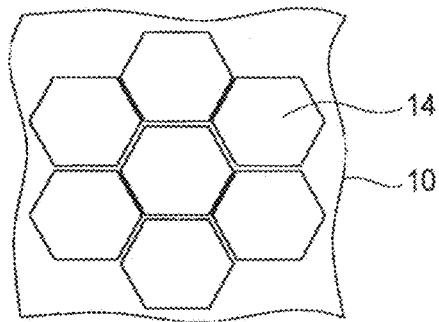
FIG. 3B is a plan view illustrating another example of the shapes of etching masks.

As illustrated in FIG. 3A, when the etching mask 14 is formed to have rounded corner portions, singulated chips also have rounded corner portions. In other words, this top-surface shape of the etching mask 14 and semiconductor chip is a shape which includes no part at which straight lines (line segments), which constitute the contour, are in contact with each other, that is, a shape in which line segments, which constitute portions of the contour, are separated from each other. By forming each corner portion in a rounded shape, the mechanical strength of the chip can be increased.

The top surface of the etching mask 14 may have a polygonal shape with five or more sides. For instance, in the example of FIG. 3B, the respective etching masks 14 have hexagonal top surfaces, and are arranged in a honeycomb shape. When the etching mask has such a top-surface shape, a semiconductor chip having a polygonal top surface with five or more sides is obtained. Compared to a semiconductor chip configured such that each interior angle of the polygon is 90°, a semiconductor chip configured such that each interior angle of the polygon is more than 90° has a higher mechanical strength.

Figure 3C:
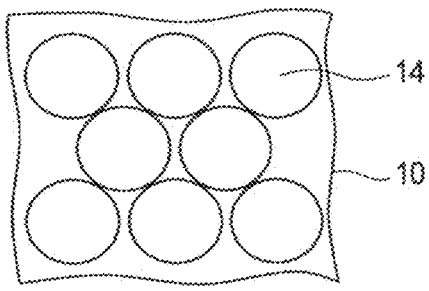
FIG. 3C is a plan view illustrating still another example of the shapes of etching masks.

The etching mask 14 may have a circular top surface, as illustrated in FIG. 3C. When the etching mask has such a top-surface shape, a semiconductor chip having a circular top surface is obtained. The semiconductor chip having the circular top surface has a mechanical strength which is equal to or higher than the mechanical strength of the semiconductor chip having the top surface with rounded corner portions.

Figure 3D:
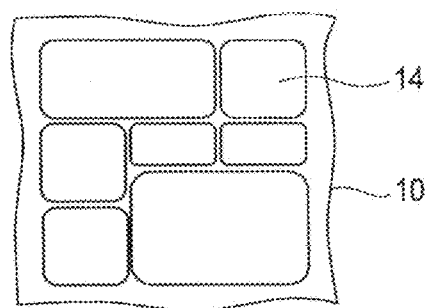
FIG. 3D is a plan view illustrating still another example of the shapes of etching masks.
Figure 3E:
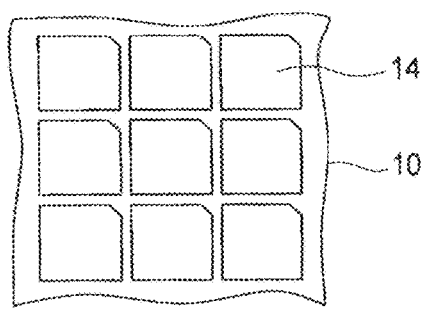
FIG. 3E is a plan view illustrating still another example of the shapes of etching masks.

When the top surface shape of the semiconductor chip has rotation symmetry, the orientation of the semiconductor chip cannot be adjusted based on only the top surface shape of the semiconductor chip. As illustrated in FIG. 3E, when the top surface of the etching mask 14 has a shape without rotation symmetry, a semiconductor chip with the top surface having no rotation symmetry is obtained. The orientation of such a semiconductor chip can be adjusted, for example, based on only the top surface shape of the semiconductor chip. Incidentally, although the shape having no rotation symmetry is not particularly limited, examples of this shape include such a shape that the shape of at least one corner portion differs from the shapes of the other corner portions, and a shape having a notch.

It is not necessary that all the etching masks, which are formed on the semiconductor substrate, have the same shape. For example, the etching masks 14 may be formed with a pattern of different shapes as illustrated in FIG. 3D.

No matter which shapes the etching masks have, semiconductor chips are singulated to have top surface shapes which substantially faithfully reflect the top surface shapes of these masks.

The material of the insulation film 15 is not particularly limited, if the material can suppress adhesion of a precious metal catalyst to the semiconductor substrate, and either an organic insulative material or an inorganic insulative material may be used. Examples of the organic insulative material include organic resins such as a polyimide, a fluororesin, a phenol resin, and an epoxy resin. Examples of the inorganic insulative material include an oxide film and a nitride film. It is not always necessary that the insulation film 15 be separately formed on the element region 12. A part of the insulation film, which is included in the element region 12, can be used as the insulation film 15.

Incidentally, when a material with shock-absorbing properties such as an organic resin is used as the insulation film, this insulation film can be left on a final product as a permanent film. If the left insulation film is utilized as a shock-absorbing film of the singulated chip, such a structure can be obtained that the top surface of the singulated chip is completely covered with the shock-absorbing film, and therefore the mechanical strength of the chip is enhanced.

The material of the protection film 16 is not particularly limited if it is not corroded by an etching liquid. For example, the protection film 16 can be formed by using organic resins such as a polyimide, a fluororesin, a phenol resin and an epoxy resin, or precious metals such as Au, Ag and Pt.

The exposed region 18 is used for singulation of semiconductor chips, and corresponds to a so-called dicing line. The width of the exposed region 18 is not particularly limited, and is in a range of, e.g. 1 to 200 μm.

Figure 4:
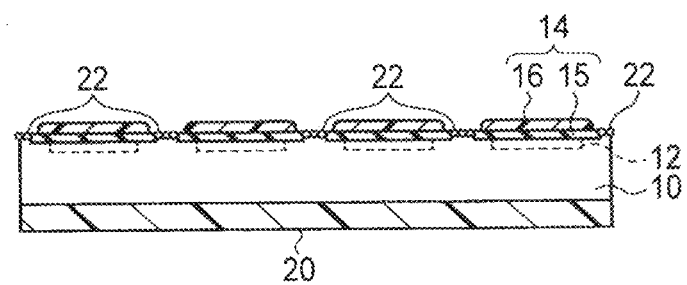
FIG. 4 is a cross-sectional view illustrating a fabrication step following a fabrication step of FIG. 2.
Figure 5:
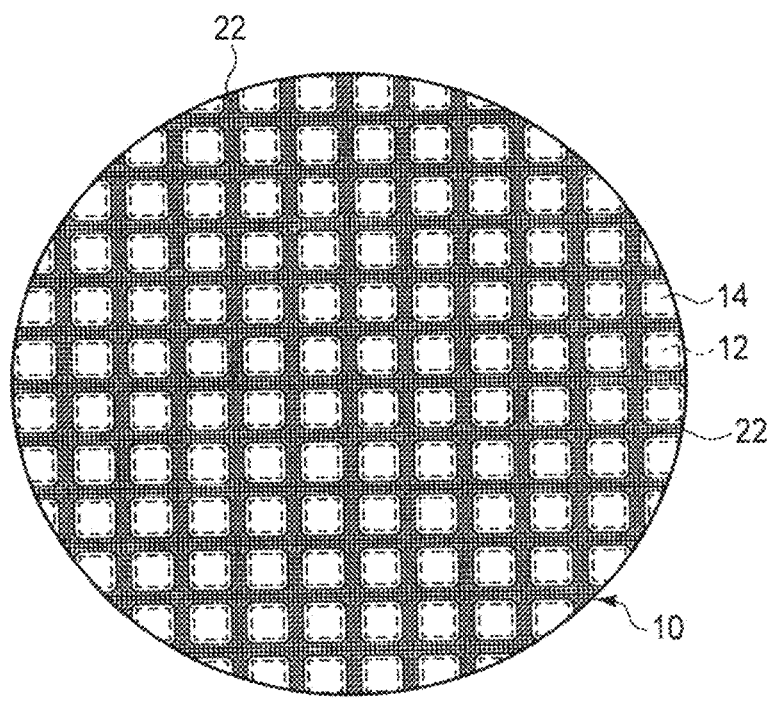
FIG. 5 is a top view of a semiconductor substrate on which a precious metal catalyst is disposed.

A precious metal catalyst 22 is disposed on the exposed region 18, as illustrated in FIG. 4. In this case, the etching mask 14 functions as a mask for preventing the precious metal catalyst 22 from adhering to locations other than the exposed region 18. FIG. 5 shows a top view of the semiconductor substrate 10 on which the precious metal catalyst 22 is disposed on the exposed region 18.

The precious metal catalyst 22 activates an oxidation reaction of a portion of the semiconductor substrate 10 that is in contact with this precious metal catalyst 22. An arbitrary precious metal having an effect of activating this oxidation reaction can be used as the precious metal catalyst 22. The material of the precious metal catalyst 22 can be selected from, for instance, Au, Ag, Pt and Pd.

The precious metal catalyst 22 can be disposed, for example, in a granular shape. The granular precious metal catalyst is preferable since it is stable even during etching. Examples of the shape of the granular catalyst include a spherical shape, a rod shape and a plate shape. In the case of the spherical shape, since the direction of progress of etching of the semiconductor substrate becomes closer to the vertical direction, this spherical shape is preferable. The grain size of the granular catalyst is not particularly limited, and may be in a range of, e.g. several-tens to several-hundreds of nanometers. Incidentally, in order to facilitate chip dicing after etching, it is preferable to dispose the granular catalyst at high density or in multiple layers.

FIG. 6 is a schematic view illustrating a part of the top surface of the semiconductor substrate 10 on which the granular precious metal catalyst 22 is disposed on the exposed region 18.

The precious metal catalyst can be disposed on the exposed region 18 of the semiconductor substrate 10, for example, by methods such as electrolytic plating, reduction plating, and displacement plating. Alternatively, coating of a dispersion liquid including precious metal particles, evaporation, sputtering, etc. may be used. Among these methods, when the displacement plating is used, the granular precious metal catalyst can be uniformly and directly formed on the exposed region 18 which corresponds to a dicing line.

A silver nitrate solution, for example, can be used in order to dispose the granular precious metal catalyst by displacement plating. An example of this process will be described below. As a displacement plating liquid, for example, use may be made of a mixture liquid of silver nitrate solution, hydrofluoric acid, and water. The hydrofluoric acid has a function of removing a natural oxide film on the surface of the semiconductor substrate.

The silver nitrate concentration in the displacement plating liquid is preferably in a range of 0.001 to 0.1 mol/L, and more preferably in a range of 0.005 to 0.01 mol/L. The hydrofluoric acid concentration in the displacement plating liquid is preferably in a range of 1 to 6.5 mol/L.

The semiconductor substrate 10 having a predetermined region selectively protected by the etching mask is immersed in the above-described displacement plating liquid for about 1 to 5 minutes. Thereby, Ag nanoparticles functioning as the granular precious metal catalyst 22 can be selectively precipitated on only the exposed region 18 of the semiconductor substrate 10. Incidentally, the temperature of the displacement plating liquid is not particularly limited, and may be properly set at, e.g. 25° C. or 35° C.

FIG. 7 shows an SEM image of a sample in which Ag nanoparticles are formed on a silicon substrate by displacement plating. In this case, a single-crystal silicon substrate, on which a predetermined region is protected by an etching mask, was immersed in a displacement plating liquid at 25° C. for three minutes, and Ag nanoparticles were formed on an exposed region of the single-crystal silicon substrate.

As the etching mask, an insulation film, which is formed of a polyimide film, was used. As the displacement plating liquid, use was made of an aqueous solution containing 0.005 mol/L of silver nitrate and 5.0 mol/L of hydrofluoric acid. In the SEM image of FIG. 7, Ag nanoparticles 22a, which correspond to the granular precious metal catalyst 22, are shown as white regions. The grain size of the Ag nanoparticles 22 is about 100 nm.

The grain size of the Ag nanoparticles 22 can be controlled, for example, by varying the immersion time or the concentration of the displacement plating liquid. It is preferable that the grain size of the Ag nanoparticles is about several-tens to several-hundreds of nanometers. It was confirmed that if the Ag nanoparticles with the grain size in such a range are formed, the etching of the semiconductor substrate well progresses when the semiconductor substrate is immersed in the etching liquid.

Incidentally, the entire surface of the exposed region of the single-crystal silicon substrate is not always completely covered with Ag nanoparticles. Parts of the surface of the semiconductor substrate 10 are shown as black areas at parts of the SEM image of FIG. 7.

Figure 8:
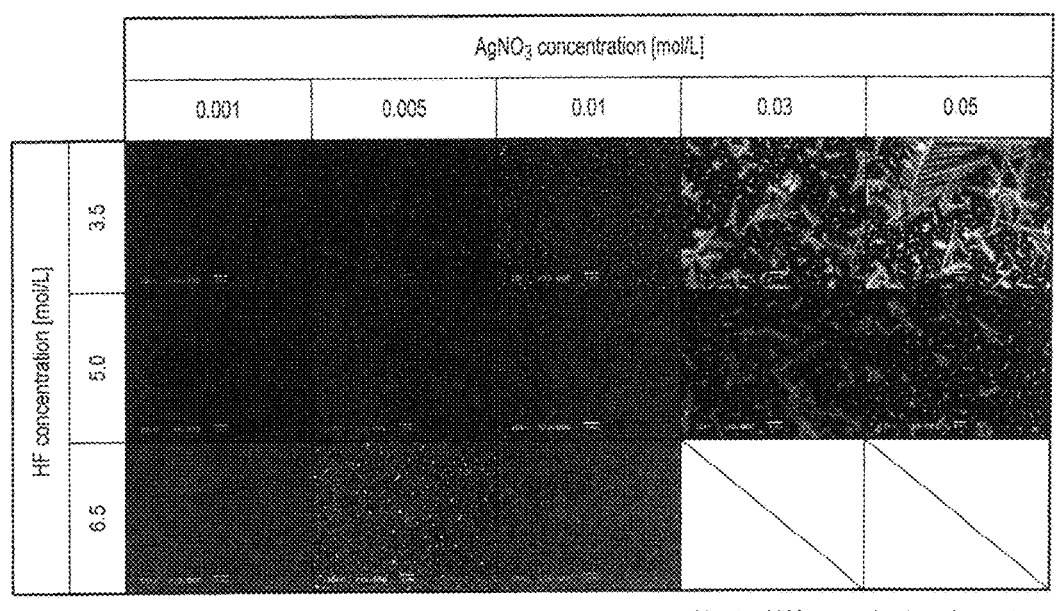
FIG. 8 is an SEM photograph illustrating results of displacement plating.

FIG. 8 shows, in a table, examples of results obtained when an Si substrate was immersed for one minute in various displacement plating liquids with different compositions. The concentration of silver nitrate solution in the displacement plating liquid was 0.001 to 0.05 mol/L, the concentration of hydrofluoric acid was 3.5 to 6.5 mol/L, and the temperature of the displacement plating liquid was 25° C.

No matter which value in the range of 3.5 to 6.5 mol/L is the concentration of hydrofluoric acid in the displacement plating liquid, dendritic growth of crystals of Ag is confirmed when the concentration of silver nitrate is 0.03 mol/L or more, and formation of Ag nanoparticles with the grain size of about 10 to 100 nm is confirmed when the concentration of silver nitrate is 0.05 to 0.01 mol/L. In order to obtain Ag nanoparticles with a desired grain size, it should suffice if displacement plating is performed by properly setting the composition and temperature of the displacement plating liquid, the immersion time, etc.

As illustrated in FIG. 9, the semiconductor substrate, on which the precious metal catalyst 22 is disposed, is immersed in an etching liquid 30. As the etching liquid 30, use is made of a mixture liquid including hydrofluoric acid and an oxidizer. By the action of the precious metal catalyst 22, oxidation of the semiconductor substrate 10 occurs only at locations (exposed region 18) where the semiconductor substrate 10 is are in contact with the precious metal catalyst 22. It is possible to dissolve and remove the oxidized region of the semiconductor substrate 10 by the hydrofluoric acid, and to selectively etch only the portions that are in contact with the granular precious metal catalyst 22. In short, the etching of the exposed region 18 anisotropically progresses.

During selectively dissolving and removing the portions of the semiconductor substrate 10, the precious metal catalyst 22 does not change itself and moves downwardly in the semiconductor substrate 10 with the progress of etching, and then etching is performed again there. Accordingly, when the semiconductor substrate 10 is immersed in the etching liquid 30, etching progresses in the direction perpendicular to the surface of the semiconductor substrate 10, and a plurality of grooves or holes are formed. In the present embodiment, the grooves or holes, which are thus formed, are referred to as deep trenches 24a. FIG. 10 is a top view of the semiconductor substrate 10 having the deep trenches 24a formed in the exposed region 18. Although not clearly illustrated, many deep trenches 24a are formed in the exposed region 18 of the semiconductor substrate 10.

It can be said that the regions where the deep trenches 24a are formed correspond to the regions (white regions) in FIG. 7 where the Ag nanoparticles 22a are present. In regions (black regions) in FIG. 7 where the Ag nanoparticles 22a are not present, the etching of the semiconductor substrate 10 does not progress. This will be described later.

As the etching liquid, a mixture liquid including hydrofluoric acid and an oxidizer can be used. The oxidizer can be selected from hydrogen peroxide, nitric acid, $AgNO_3$, $KAuCl_4$, $HAuCl_4$, $K_2PtCl_6$, $H_2PtCl_6$, $Fe(No_3)_3$, $Ni(NO_3)_2$, $Mg(NO_3)_2$, $Na_2S_2O_8$, $K_2S_2O_8$, $KMnO_4$, $K_2Cr_2O_7$, etc. Hydrogen peroxide is preferable as the oxidizer, since no harmful by-product is produced and no contamination of the element region occurs. Incidentally, instead of the etching liquid, a mixture gas of fluorine gas and oxidizing gas may be used, and etching may be progressed by a dry process.

The concentrations of the hydrofluoric acid and oxidizer in the etching liquid are not particularly limited. For example, use can be made of an aqueous solution in which the hydrofluoric acid concentration is 5 to 15 mol/L and the hydrogen peroxide concentration is 0.3 to 5 mol/L.

In order to more securely etch the exposed region 18 of the semiconductor substrate 10, it is desired to select an oxidizer according to the material of the substrate. For example, as the oxidizer, an Ag-containing salt, such as $AgNO_3$, is preferable in the case of a Ge substrate, and $K_2S_2O_8$ is preferable in the case of an SiC substrate. In the case of a substrate made of III-V semiconductors such as GaAs and GaN or the case of an Si substrate, hydrogen peroxide is preferable as the oxidizer. When an Si substrate, among others, is used, etching progresses very well.

Figure 11:
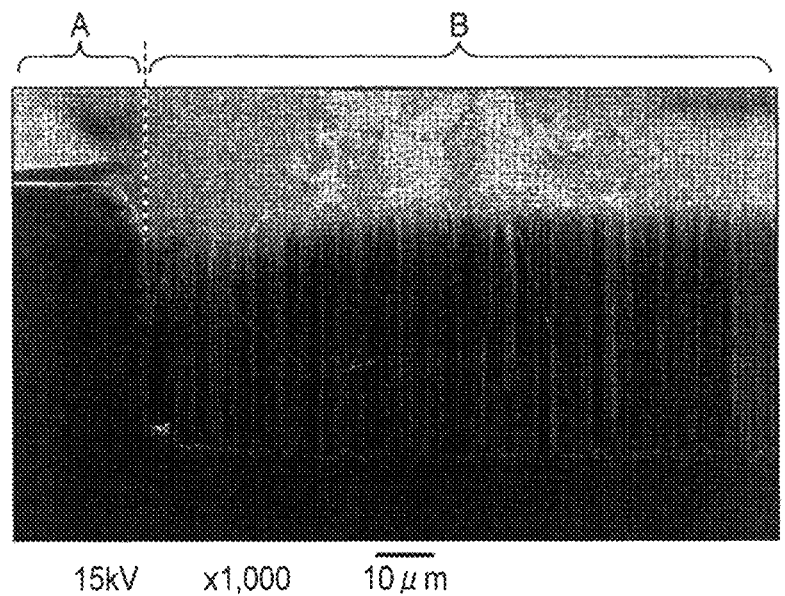
FIG. 11 is a cross-sectional SEM photograph of a silicon substrate after an etching process.

FIG. 11 shows an example of a cross-sectional SEM image of a single-crystal silicon substrate after immersion in an etching liquid. On the exposed region of the single-crystal silicon substrate, a plurality of Ag nanoparticles were formed, as shown in the SEM image of FIG. 7. The SEM image of FIG. 11 is a result obtained by immersing such a single-crystal silicon substrate for 10 minutes in an aqueous solution in which the hydrofluoric acid concentration is 10 mol/L and the hydrogen peroxide concentration is 1 mol/L.

In the SEM image of FIG. 11, a region A is a part protected by the etching mask, and a region B corresponds to the exposed region where the plural Ag nanoparticles are disposed as the precious metal catalyst. In the region B, a plurality of deep trenches are shown as black regions. It is understood that, according to the present embodiment, a plurality of deep trenches can be formed in the exposed region of the silicon substrate, which corresponds to an opening part of the etching mask pattern. Since the deep trenches are formed by so-called self-alignment, the deep trench, which is located closest to the region A that is protected by the etching mask, can have a side wall in the same plane as the end face of the etching mask.

Figure 12:
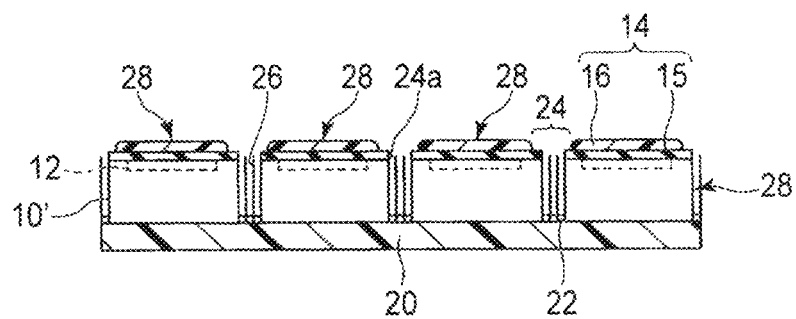
FIG. 12 is a cross-sectional view illustrating a fabrication step following the fabrication step of FIG. 9.

The etching is progressed, and the deep trenches 24a are made to reach the back surface of the semiconductor substrate 10, as illustrated in FIG. 12. By disposing the granular precious metal catalyst 22 at high density on the exposed region 18 on the semiconductor substrate 10, the density of deep trenches 24a formed in this exposed region 18 also increases. Mutually joined trenches 24a form a chip dicing groove 24. When the etching is completed, the semiconductor substrate 10 is singulated into a plurality of chip main bodies 10' each including the element region 12. In this case, a structure 28 including the chip main body 10' and the etching mask 14 is referred to as a chip or a semiconductor chip.

As illustrated in FIG. 12, a needle-shaped residue 26 occurs between the singulated chip main bodies 10', at a location corresponding to a gap of the granular precious metal catalyst 22. FIG. 13 shows a top view of the semiconductor substrate 10 in which needle-shaped residues 26 have occurred. At this time point, the singulation process is completed, and each chip 28 can be picked up and used. This method is advantageous in that singulated semiconductor chips can easily be obtained.

After the singulation, if necessary, the granular precious metal catalyst 22 may be chemically removed. The precious metal catalyst 22 can be removed by wet etching using a dissolving liquid. As the dissolving liquid, use can be made of an arbitrary liquid which can remove the precious metal catalyst film without corroding the semiconductor substrate 10, insulation film 15 and protection film 16. Concrete examples of the dissolving liquid include a halogen solution, an ammonium halide solution, nitric acid, and aqua regia.

After the singulation, the protection film 16 may be removed, where necessary. For removing the protection film 16, for instance, removal by dissolution using a thinner or removal by an $O_2$ plasma can be performed.

Where necessary, the insulation film 15 may also be removed. As the method of removing the insulation film 15, use can be made of removal by dissolution using a thinner, or removal by various plasmas.

Furthermore, where necessary, the needle-shaped residue 26 may be removed by etching. When the needle-shaped residue 26 has been removed, the possibility can be reduced that the needle-shaped residue adheres to the chip as dust, when the semiconductor chip 28 is picked up.

The needle-shaped residue 26 can be removed by an arbitrary etching method which can etch the semiconductor substrate material. For example, in the case of a silicon substrate, either a wet etching method or a dry etching method may be used. The etching liquid in the wet etching method can be selected from, for instance, a mixture liquid of hydrofluoric acid, nitric acid and acetic acid, tetramethylammonium hydroxide (TMAH), KOH, etc. An example of the dry etching method is plasma etching using a gas such as $SF_6$, $CF_4$, $C_2F_6$, $C_3F_8$, $CClF_2$, $CCl_4$, $PCl_3$, or $CBrF_3$.

FIG. 14 is a perspective view of a semiconductor chip 28 according to an embodiment. As illustrated in FIG. 14, in the semiconductor chip 28 according to the embodiment, that surface of the chip main body 10', on which the element region is formed, is covered with a multilayered body of the insulation film (not shown) used as a part of the etching mask, and the protection film 16 used as the other part of the etching mask. An end face of this protection film 16 is, at least partly, flush with a side surface of the chip main body 10'. It can be said that the plan-view shape of the chip main body 10', to be more specific, the contour of the top surface, agrees, at least partly, with the contour of an orthogonal projection of the protection film 16 onto a plane including this top surface. If this structure is adopted, that area of the top surface of the chip main body 10' that is exposed from the protection film 16 can be greatly reduced. Accordingly, the mechanical strength of the chip can be increased. The protection film 16 can also cover the entirety of the top surface of the chip main body 10'. In this case, the strength is further increased.

In the case where the protection film 16 is made of a material with a high shock resistance, the effect of the protection film 16, which suppresses chip cracking due to external shock or contact with a pickup device, is further enhanced. Examples of the material with a high shock resistance include organic resins such as a polyimide, a fluororesin, a phenol resin, and an epoxy resin.

Furthermore, as illustrated in FIG. 14, since corner portions C1 at the top surface of the semiconductor chip 28 have rounded shapes, the shock resistance is enhanced. At the bottom surface, too, since corner portions C2 have rounded shapes, the flexural strength of the semiconductor chip 28 according to this embodiment does not lower. Thereby, chip cracking due to external shock or contact with a chip pickup device can also be greatly suppressed.

Since the semiconductor chip 28 in this embodiment is obtained by singulation using a chemical etching process, the side surfaces thereof suffer no physical damage. This leads to an improvement of the reliability of the operation of the semiconductor chip.

FIG. 15A to FIG. 15E illustrate the outline of the process of singulating the semiconductor substrate into semiconductor chips by using an insulation film as an etching mask and by disposing a granular precious metal catalyst. Incidentally, the protection film 16 is omitted here.

Figure 15A:
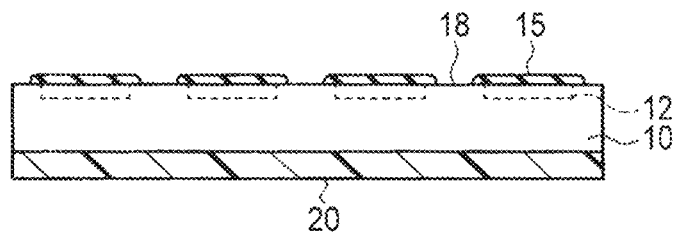
FIG. 15A is a cross-sectional view illustrating a fabrication step of a manufacturing method of semiconductor chips according to an embodiment.

As illustrated in FIG. 15A, in a semiconductor substrate 10 in which a plurality of element regions 12 are formed, the element regions 12 are protected by an insulation film 15 functioning as an etching mask. The etching mask demarcates, on the semiconductor substrate 10, a region protected by the etching mask, and an exposed region 18 which is exposed. Incidentally, a dicing sheet 20 is provided on the back surface of the semiconductor substrate 10.

Figure 15B:
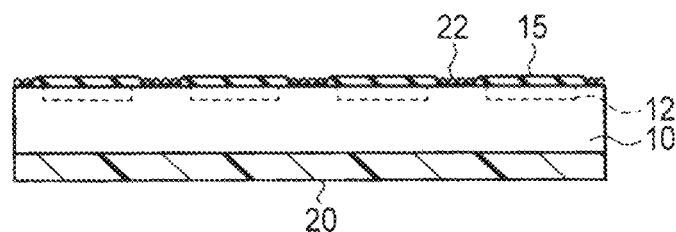
FIG. 15B is a cross-sectional view illustrating a fabrication step following the fabrication step of FIG. 15A.
Figure 15C:
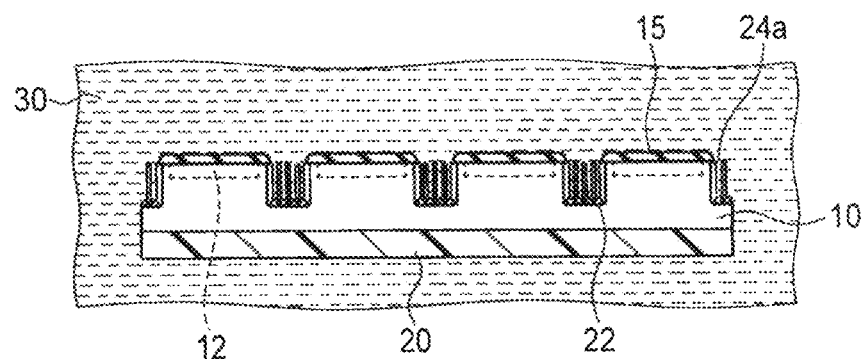
FIG. 15C is a cross-sectional view illustrating a fabrication step following the fabrication step of FIG. 15B.

As illustrated in FIG. 15B, a granular precious metal catalyst 22 is disposed on the exposed region 18 of the semiconductor substrate 10. As illustrated in FIG. 15C, the semiconductor substrate 10 is immersed in an etching liquid 30. Etching progresses on the exposed regions 18 of the semiconductor substrate 10, and a plurality of deep trenches 24a are formed in each of the exposed regions 18. By the formation of the deep trenches 24a, needle-shaped residues will occur in the etched regions.

Figure 15D:
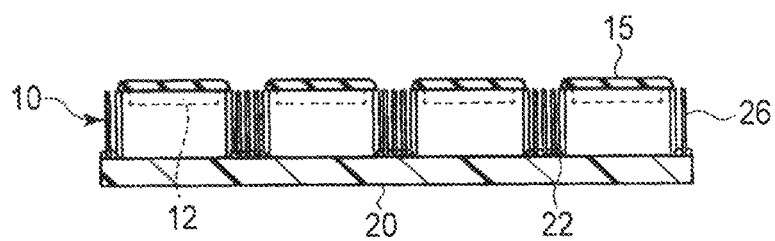
FIG. 15D is a cross-sectional view illustrating a fabrication step following the fabrication step of FIG. 15C.
Figure 15E:
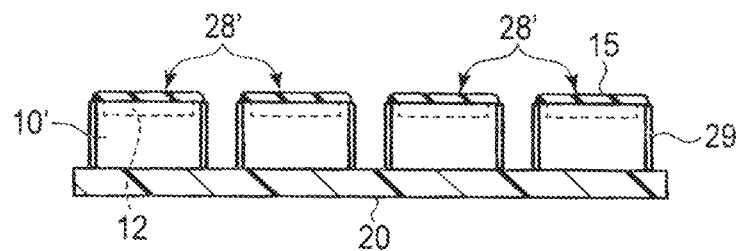
FIG. 15E is a cross-sectional view illustrating a fabrication step following the fabrication step of FIG. 15D.
Figure 16:
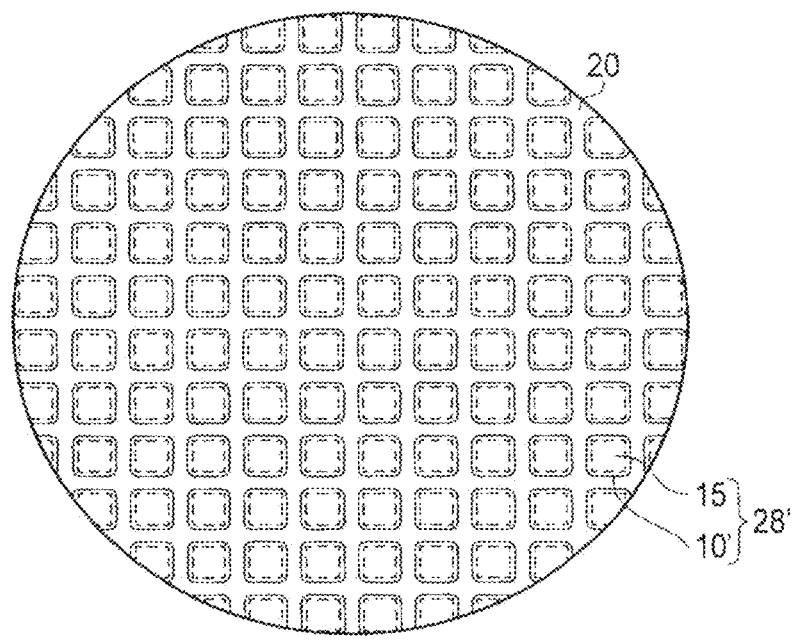
FIG. 16 is a top view illustrating singulated semiconductor chips.

After the etching has progressed to the back surface of the semiconductor substrate 10, as illustrated in FIG. 15D, needle-shaped residues 26 exist in regions corresponding to the exposed regions 18. By removing the needle-shaped residues 26 and precious metal catalyst 22 on the dicing sheet 20, semiconductor chips 28' as illustrated in FIG. 15E are obtained. In this case, the semiconductor chip 28' includes a chip main body 10' and insulation film 15. As illustrated in the top view of FIG. 16, the dicing sheet 20 is exposed between the semiconductor chips 28'.

On side surfaces 29 of the chip main body 10' illustrated in FIG. 15E, owing to the granular precious metal catalyst 22 located near the etching mask, etching traces each extending from the top surface toward the bottom surface are formed so as to be continuous in the circumferential direction of the chip main body 10'. The etching traces are recesses or projections reflecting the size and shape of the used granular precious metal catalyst 22, and are formed as vertical stripes in many cases, but are formed as obliquely extending recesses or projections in some cases. Although the width of the recess or projection, which forms the etching trace, varies depending on the grain size of the granular precious metal catalyst, this width is, in general, about 10 to 100 nm, and, in particular, about 10 to 50 nm.

Figure 17A:
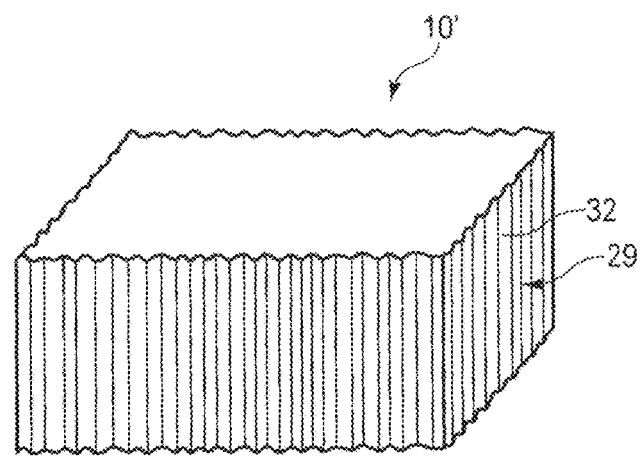
FIG. 17A is a perspective view which schematically illustrates an example of etching traces.
Figure 17B:
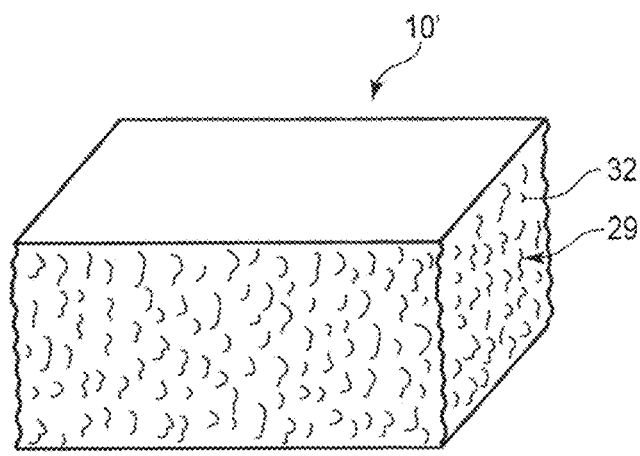
FIG. 17B is a perspective view which schematically illustrates another example of the etching traces.

An example of the etching trace on the side surface 29 of the chip main body 10' is illustrated in a schematic view of FIG. 17A. As illustrated, nano-order etching traces are formed on the side surface 29. Since the etching traces are nano-order recesses or projections, the etching traces have no adverse effect even if they are present on the side surface 29 of the chip main body 10'. Incidentally, depending on etching conditions, the etching traces 32 are formed, in some cases, not in vertical stripe shapes, but as recesses or projections with random shapes and dispositions as illustrated in FIG. 17B.

Process and mechanism for forming the etching traces 32 will be described below.

In the case of forming a granular precious metal catalyst 22 on the exposed region 18, the shape of the area occupied by the precious metal catalyst 22 does not completely agree with the shape of the exposed region 18 but has recesses or protrusions corresponding to the shapes of granules as shown in FIG. 6. When etching is performed under an appropriate condition, for example, condition where the hydrofluoric acid concentration is 10 mol/L and the hydrogen peroxide concentration is 2 mol/L, the etching progresses only in the immediate vicinity of the precious metal catalyst 22. Thus, reflecting the granular shape of the precious metal catalyst 22, the etching traces 32 are formed on the side surface of the chip main body 10' such that each of the etching traces 32 extends in the direction from the top surface to the bottom surface. On the other hand, when etching is performed under the condition where the oxidizer concentration of the etching liquid is high, for example, the condition where the hydrofluoric acid concentration is 2.5 mol/L and the hydrogen peroxide concentration is 8 mol/L, the precious metal catalyst 22 can act on a larger region. Thus, the etching traces 32 do not reflect the granular shape of the precious metal catalyst 22, but are formed as the random recesses or protrusion.

Figure 17C:
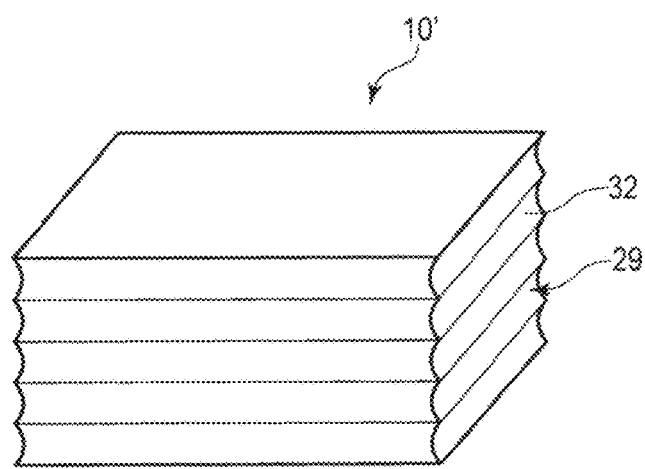
FIG. 17C is a perspective view which schematically illustrates still another example of the etching traces.

When singulation is implemented by plasma etching, as illustrated in FIG. 17C, horizontal grooves, which are parallel to the device formation surface, are formed on the side surface 29 of the chip main body 10' due to a switching operation in the plasma process. A semiconductor chip having such as structure differs from the semiconductor chip according to the present embodiment.

The semiconductor chip 28' having etching traces on the side surface 29 can be mounted on a substrate 35 via a bonding material 34, as illustrated in FIG. 18. Incidentally, the bonding material 34 is, for instance, an adhesive, a self-adhesive film, or an anisotropic conductive film. In addition, the substrate 35 is, for instance, a circuit board or an interposer.

Compared to a structure with no etching trace on the side surface 29, the structure with etching traces on the side surface 29 has a larger surface area. Thus, the semiconductor chip 28' has a high efficiency of heat radiation from the side surface 29. In particular, for an optical semiconductor chip or a power device, the heat radiation property of the chip is an important characteristic in guaranteeing the normal operation of the chip. Incidentally, in FIG. 18, an electrode pad 51 is exposed on the top surface of the semiconductor chip. The electrode pad will be described later.

As illustrated in FIG. 19, also when a bonding member such as a solder 36 is disposed between the substrate 35 and the semiconductor chip 28', an effect of the etching traces on the side surface 29 can be exhibited. In this case, an excess solder may move upward on the side surface 29 by a capillary phenomenon. Thereby, the height of the chip 28' from the substrate 35 is reduced, and the non-uniformity in height is suppressed. In addition, the tolerable coating amount margin of the solder 36 can be increased, and the management of fabrication steps becomes easier. Furthermore, when this structure is adopted, since the side surface 29 is in contact with the solder 36 having a high heat conductivity, an increase in heat release can also be expected. The same effect is also obtained in the case of using an underfiller in place of the solder 36.

A semiconductor device 40, as illustrated in FIG. 20, is obtained when the semiconductor chip 28' having etching traces on the side surface 29 is disposed on a lead frame and is resin-molded. In the semiconductor device 40 illustrated, the semiconductor chip 28' is disposed on a lead frame 41a via a bonding material 43. This semiconductor chip 28' has the above-described nano-order etching traces on the side surface 29, and is electrically connected to lead frames 41b by Al wires 45. These are sealed by mold resins 47a and 47b, excluding end portions for external connection of the lead frames 41b.

Since the nano-order etching traces are formed on the side surface 29 of the semiconductor chip 28', an anchor effect acts between the semiconductor chip 28' and the mold resin 47b, and the adhesivity can be enhanced. Thus, for example, even a material, which generally has low adhesivity to a chip, such as a fluorine-contained resin, can be used as the mold resin, and the number of choices of the mold material can be increased.

Figure 21A:
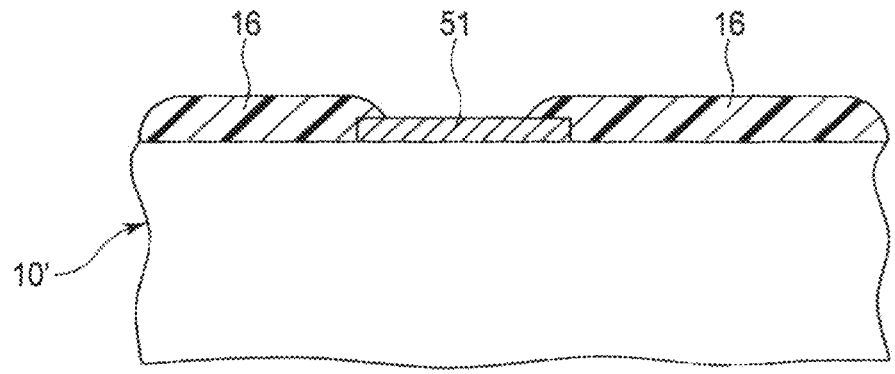
FIG. 21A is an enlarged cross-sectional view illustrating an example of a chip main body including an electrode pad.
Figure 21B:
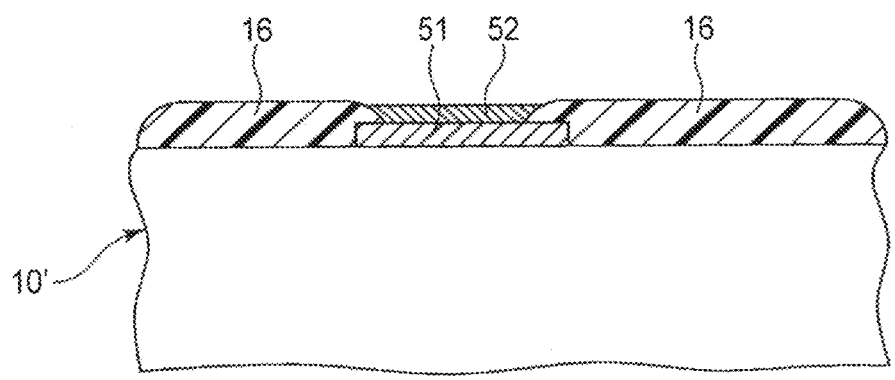
FIG. 21B is an enlarged cross-sectional view illustrating an example of a chip main body in which an electrode pad is covered with an electrode protection layer.

Incidentally, even when the chip main body 10' is protected by the protection film 16, there is a case in which the electrode pad 51 is exposed for external connection to the outside, as illustrated in FIG. 21A. Since the electrode pad 51 is made of aluminum in usual cases, the electrode pad 51 has low resistance to the etching liquid containing hydrofluoric acid and an oxidizer. As illustrated in FIG. 21B, by providing an electrode protection layer 52, the electrode pad 51 can be protected from the etching liquid.

The electrode protection layer 52 can be formed by using an arbitrary material having resistance to the etching liquid, and either a metallic material or a resin material may be used. For example, when the electrode protection layer 52 is formed by using a metal such as Ni/Au, even if the electrode protection layer 52 is left on the electrode pad 51, no problem will arise in a subsequent fabrication step. The electrode protection layer 52, which is formed by using a resin, may be removed by a proper method after the etching process.

Figure 22:
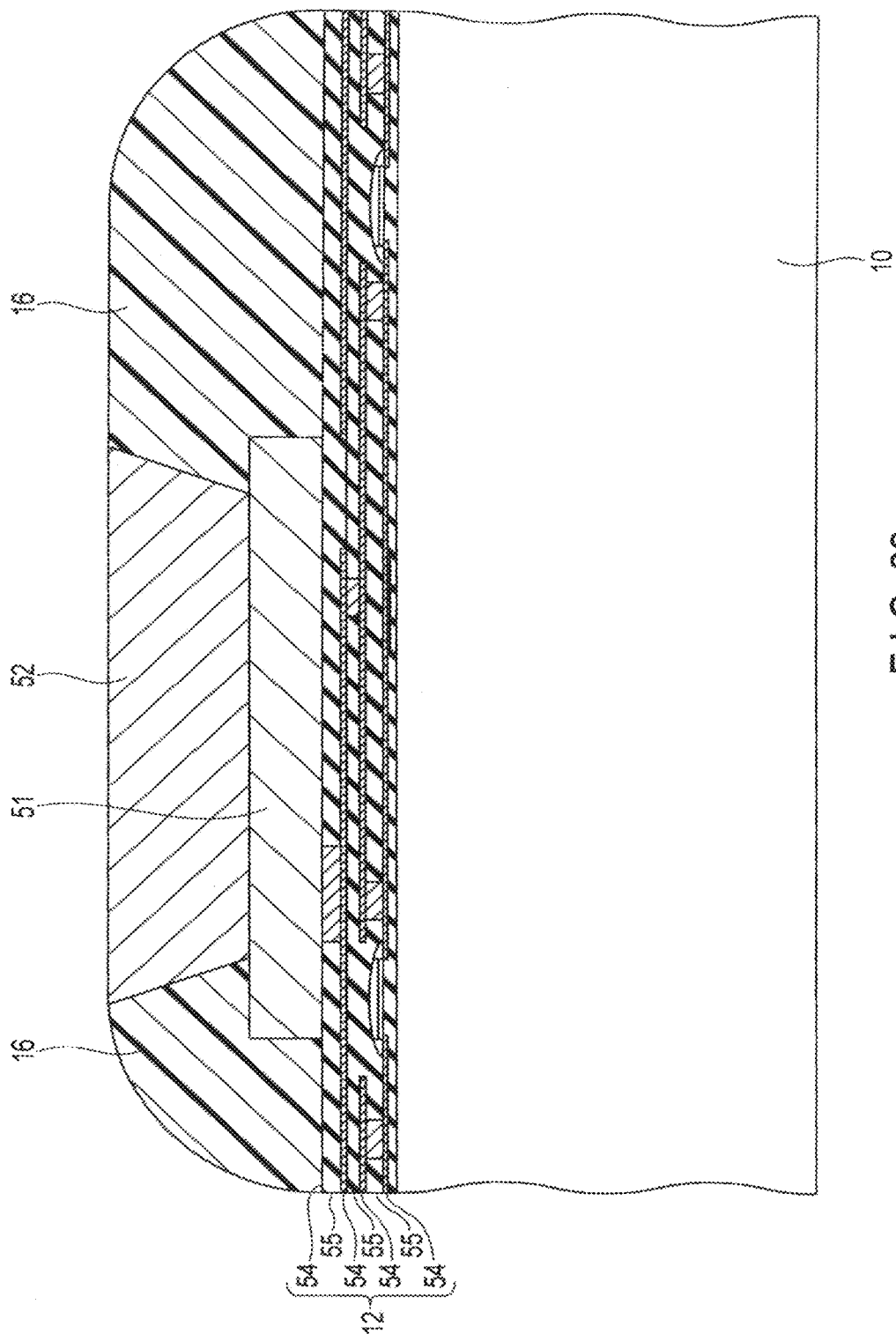
FIG. 22 is an enlarged cross-sectional view illustrating an insulation film, etc. of the chip main body.

Referring now to FIG. 22, a description is given of the dimensions of the protection film which protects the element region, etc. The thickness of the semiconductor substrate 10, in which the element region is formed, is usually about several-hundreds of micrometers, and the thickness of a plurality of insulation films 54 and wirings 55 included in the element region is about several-tens to several-hundreds of nanometers. The width of the line & space of each of the wirings 55 is about several-tens to several-hundreds of nanometers. Incidentally, the insulation films 54 are generally made of SiN, etc.

The line & space of each protection film 16, which protects the element region, is about several-tens to several-hundreds of micrometers. The protection film 16 is formed with a thickness of about several to several-tens of micrometers, in consideration of asperities on the topmost surface of the semiconductor substrate 10.

As has been described with reference to FIG. 22, while the thickness of the protection film 16 which protects the element region 12 is about several-tens to several-hundreds of micrometers, the thickness of the insulation film 54 in the element region 12 is about several-tens to several-hundreds of nanometers. Since the insulation film 54 in the element region 12 is very thin, when this insulation film 54 is used as an etching mask, a fine exposed region can be formed. Referring to FIG. 23, this process is described.

Figure 23A:
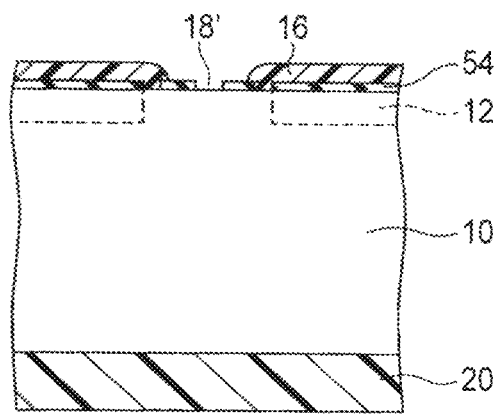
FIG. 23A is a cross-sectional view illustrating a fabrication step of a manufacturing method of semiconductor chips according to another embodiment.

As illustrated in FIG. 23A, a plurality of element regions 12 are formed in the semiconductor substrate 10, on the back surface of which a dicing sheet 20 is disposed, and an insulation film 54 and a protection film 16 are successively stacked on each element region 12. An exposed region 18', at which the semiconductor substrate 10 is exposed, exists between neighboring element regions 12. As described above, since the thickness of the insulation film 54 is about several-tens to several-hundreds of nanometers, the width of the exposed region 18' can also be set to be fine at about several-tens to several-hundreds of nanometers.

Figure 23B:
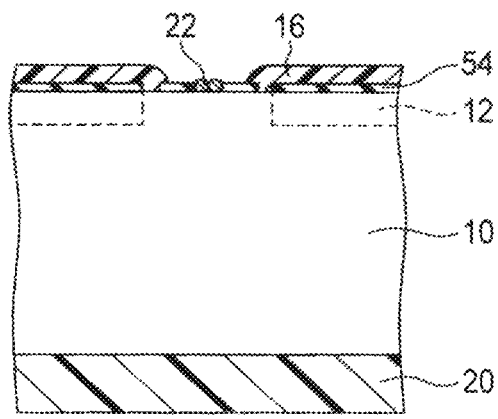
FIG. 23B is a cross-sectional view illustrating a fabrication step following the fabrication step of FIG. 23A.

As illustrated in FIG. 23B, a precious metal catalyst 22 is disposed on the exposed region 18'. At this time, by adopting the above-described displacement plating method, the precious metal catalyst 22 can be selectively disposed on only the exposed region 18', avoiding the insulation film 54 and protection film 16.

Figure 23C:
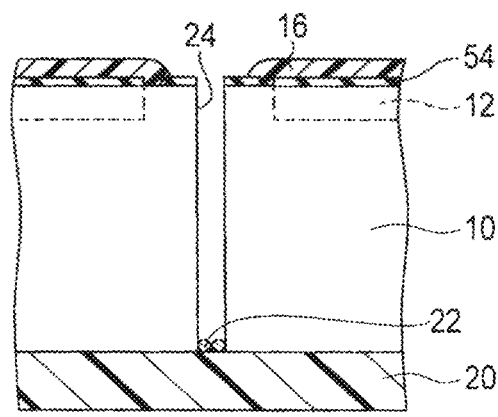
FIG. 23C is a cross-sectional view illustrating a fabrication step following the fabrication step of FIG. 23B.

The semiconductor substrate 10, on which the precious metal catalyst 22 is selectively disposed on the exposed region 18', is immersed in the above-described etching liquid. Thereby, the exposed region 18' of the semiconductor substrate is selectively removed. As a result, chip dicing grooves 24 as shown in FIG. 23C are formed, and the semiconductor substrate 10 is singulated into chip main bodies.

According to this method, since the width of the exposed region 18', which is used as an exposed dicing line, corresponds to the interval between the insulation films 54, the width of the dicing line can theoretically be set at about several-tens to several-hundreds of nanometers. This is advantageous in that the dicing line becomes thinner and the effective chip area increases.

The precious metal catalyst, which is disposed on the exposed region of the semiconductor substrate, is not limited to the granular one, but may be a film-shaped one. Next, a description is given of a method of forming a film-shaped precious metal catalyst on the exposed region of the semiconductor substrate, and performing singulation.

Figure 24A:
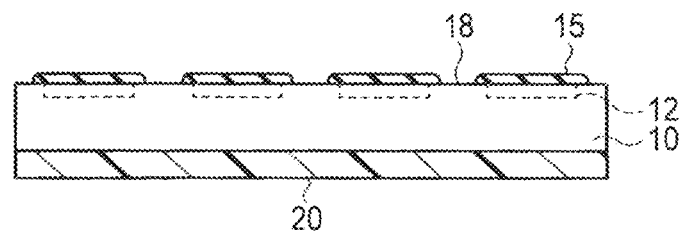
FIG. 24A is a cross-sectional view illustrating a fabrication step of a manufacturing method of semiconductor chips according to another embodiment.
Figure 24B:
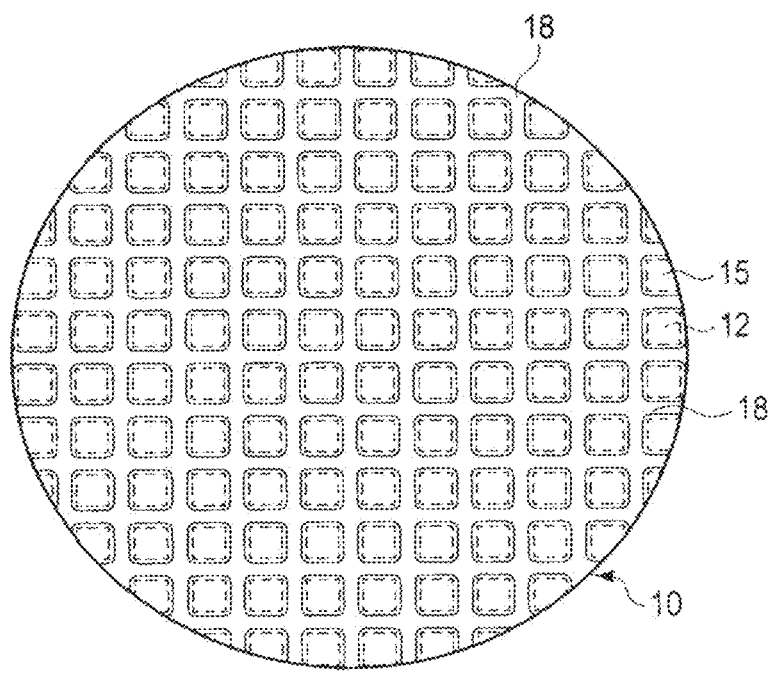
FIG. 24B is a top view illustrating the fabrication step of FIG. 24A.

FIG. 24A is a partial cross-sectional view of a semiconductor substrate 10 in which a plurality of element regions 12 are formed. Each element region 12 is protected by an insulation film 15. The insulation film 15 demarcates a region of the semiconductor substrate 10 that is covered with the insulation film 15, and an exposed region 18 as a part of the semiconductor substrate 10 that is exposed. Incidentally, a dicing sheet 20 is disposed on the back surface of the semiconductor substrate 10. FIG. 24B is a top view of this semiconductor substrate 10.

Figure 25A:
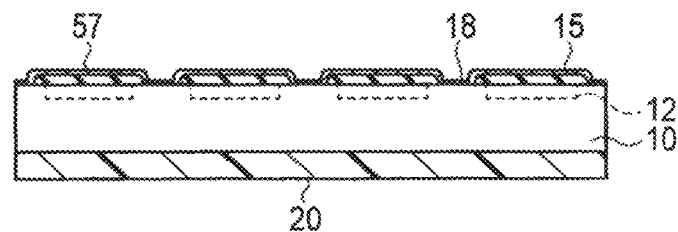
FIG. 25A is a cross-sectional view illustrating a fabrication step following the fabrication step of FIG. 24A.
Figure 25B:
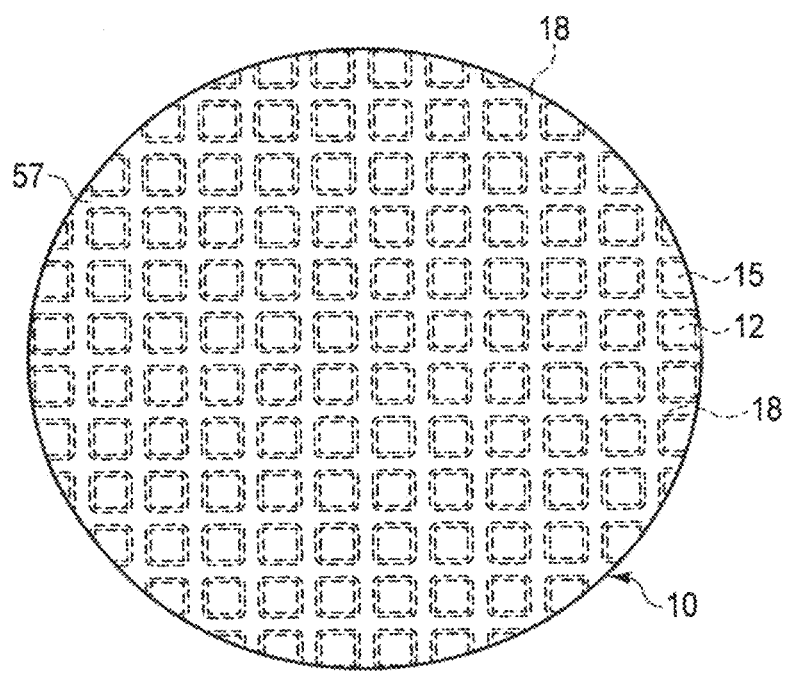
FIG. 25B is a top view illustrating the fabrication step of FIG. 25A.

As illustrated in FIG. 25A, a metal catalyst film 57 is formed on the entire top surface of the semiconductor substrate 10 on which the insulation films 15 have been formed. The metal catalyst film 57 can be formed by, for example, sputtering or evaporation. By performing the film formation using this method, the metal catalyst film 57 having a uniform film thickness can be obtained. Taking into account a subsequent fabrication step such as etching, it is desirable that the thickness of the metal catalyst film 57 be about 10 to 50 nm. Since the metal catalyst film 57 is formed on the entire surface of the semiconductor substrate 10, the insulation films 15 and exposed region 18 are covered with the metal catalyst film 57, as illustrated in the top view of FIG. 25B.

Next, as illustrated in FIG. 26A, a resist pattern 58 is formed, and those areas of the metal catalyst film 57 that are located on the exposed region 18 are selectively protected. It should suffice if the resist pattern 58 is formed by a conventional method and predetermined areas of the metal catalyst film 57 are protected. As illustrated in a top view of FIG. 26B, since the resist pattern 58 is formed on the parts corresponding to the exposed region, the metal catalyst film 57 is exposed at positions of the insulation films 15.

Figure 27A:
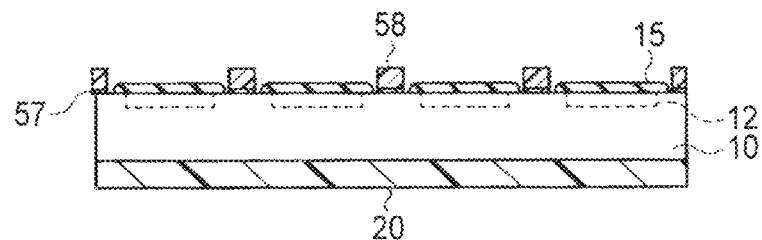
FIG. 27A is a cross-sectional view illustrating a fabrication step following the fabrication step of FIG. 26A.
Figure 27B:
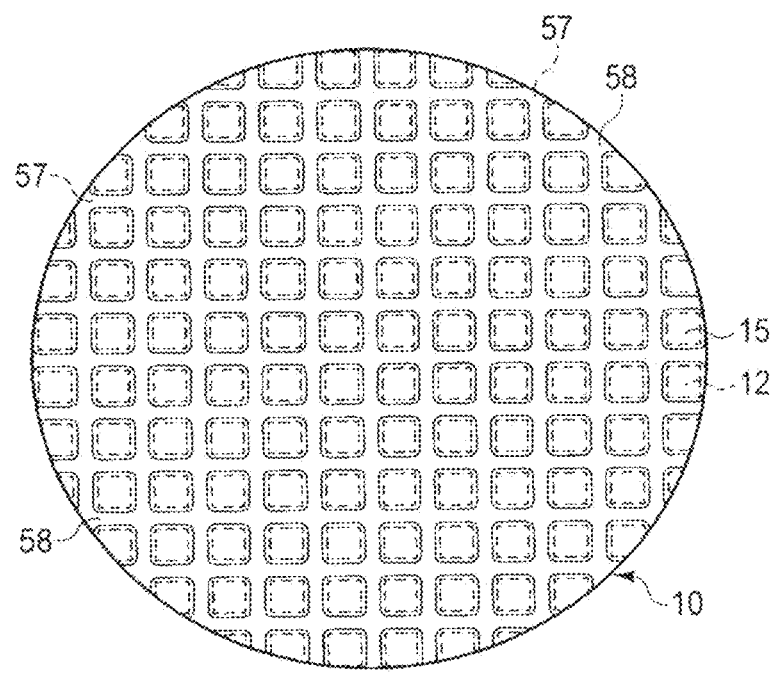
FIG. 27B is a top view illustrating the fabrication step of FIG. 27A.

If the exposed parts of the metal catalyst film 57 are removed by a conventional method, as illustrated in FIG. 27A, the metal catalyst film 57 is left only at positions of the resist pattern 58. FIG. 27B is a top view of the semiconductor substrate 10 in this state. The exposed parts of the metal catalyst film 57 can be removed by using, for instance, a halogen solution, an ammonium halide solution, nitric acid, and aqua regia.

Thereafter, the resist pattern 58 is peeled, and a metal catalyst film 57', which has been patterned as illustrated in FIG. 28A, is exposed. It should suffice if the resist pattern 58 is peeled by using a proper peeling liquid in accordance with the resist material. As illustrated in a top view of FIG. 28B, the patterned metal catalyst film 57' is left on only the exposed region 18.

Figure 29A:
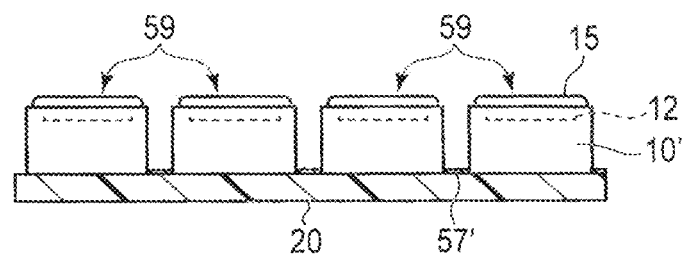
FIG. 29A is a cross-sectional view illustrating a fabrication step following the fabrication step of FIG. 28A.
Figure 29B:
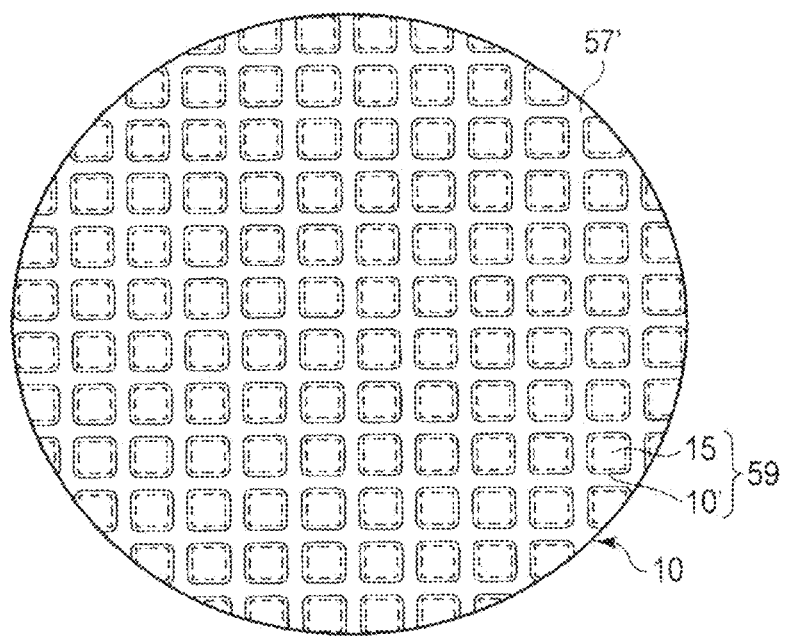
FIG. 29B is a top view illustrating the fabrication step of FIG. 29A.

Using the patterned metal catalyst film 57' as an etching mask, the substrate removal region 18 of the semiconductor substrate 10 is selectively removed by the above-described fabrication step. Thereby, as illustrated in FIG. 29A, the semiconductor substrate 10 is singulated into chip main bodies 10', and semiconductor chips 59 each including the chip main body 10' and insulation film 15 are obtained. The metal catalyst film 57' moves downward with no change in its state, and reaches the dicing sheet 20, as illustrated. FIG. 29B is a top view of the plural singulated semiconductor chips 59.

In the case of using the film-shaped precious metal catalyst, compared to the case of disposing the granular precious metal catalyst, the control of the film thickness becomes easier. In the case of using the film-shaped precious metal catalyst, the catalyst film can be formed by using an arbitrary metal, regardless of the kind of semiconductor substrate material. Furthermore, in this case, no needle-shaped residue occurs.

In the above examples, the dicing sheet is provided in direct contact with the back surface of the semiconductor substrate, but the manner of the provision of the dicing sheet is not limited to this. As illustrated in FIG. 30, the dicing sheet 20 may be disposed on the back surface of the semiconductor substrate 10 via a metallization layer 70. The metallization layer 70 can be formed by using an arbitrary metal, and either a single-layer film structure or a multilayered film structure may be adopted.

In particular, when a precious metal, such as Au, Ag, or Pt, is included in the metallization layer 70, it becomes possible to prevent the adhesive layer of the dicing sheet from being immersed in the etching liquid when the etching of the semiconductor substrate 10 has progressed and reached the back surface. Depending on cases, it is possible to leave the metallization layer 70 as such, and to use it as a metallization film at a time of die-bonding the singulated chip.

Singulation can also be performed by combining the above-described chemical etching with substrate grinding. This process is a so-called dicing-before-grinding method. This process is described with reference to FIG. 31A and FIG. 31B.

To start with, chip separation grooves 24 are formed in the semiconductor substrate 10, with a depth which is not less than the thickness of the chip main bodies 10'. Then, as illustrated in FIG. 31B, a region of the semiconductor substrate 10 on the side of the bottom surface is removed up to a level reaching the chip separation grooves 24 by a substrate grinding device 72, thereby obtaining semiconductor chips 28.

The region of the semiconductor substrate 10 on the side of the bottom surface may be removed by etching. An example of the etching is wet etching using an etching liquid selected from, for instance, a mixture liquid of hydrofluoric acid, nitric acid and acetic acid, TMAH, KOH, etc., or plasma etching using a gas selected from $SF_6$, $CF_4$, $C_2F_6$, $C_3F_8$, $CClF_2$, $CCl_4$, $PCl_3$, and $CBrF_3$.

In the case of adopting the dicing-before-grinding method, since the etching for forming the separation groove 24 is stopped before the separation groove 24 reaches the back surface of the semiconductor substrate, the rigidity of the semiconductor substrate is maintained immediately after the etching. Thus, this method is advantageous in that the handling of the substrate immediately after the etching is easy.

As has been described above, in the method according to an embodiment, semiconductor chips can be obtained by simultaneously performing an etching process on the entire exposed region of the semiconductor substrate, which corresponds to dicing lines. Thus, for example, even if the number of dicing lines is varied, singulation can be completed in a fixed time. In addition, since a plurality of semiconductor substrates can be processed by a batch process, the processing time per substrate is greatly reduced, and the productivity is enhanced.

In addition, in the method according to an embodiment, singulation is performed by using a chemical etching process using a precious metal catalyst and an etching liquid or an etching gas. Therefore, in this method, no optical alignment is needed, and there occurs no reading error of an alignment mark, or variance in position due to substrate warpage. Furthermore, since substantially the entirety of end portions of the top surface of the chip main body can be covered with a protection resin, cracking or chipping can be reduced as much as possible.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The present embodiments include the following modes.

[1]
A method of manufacturing a semiconductor chip, comprising:
forming on a semiconductor substrate a plurality of etching masks each including a protection film to demarcate a plurality of first regions of the semiconductor substrate protected by the plurality of etching masks and a second region as an exposed region of the semiconductor substrate; and
anisotropically removing the second region by a chemical etching process to form a plurality of grooves each including a side wall at least partially located in the same plane as an end face of the etching mask and a bottom portion reaching a back surface of the semiconductor substrate, thereby singulating the semiconductor substrate into a plurality of chip main bodies corresponding to the plurality of first regions.

[2]
The method of [1], wherein a top surface of the etching mask includes no corner portion which is defined by two line segments which are in contact at one end.

[3]
The method of [1], wherein a top surface of the etching mask has a polygonal shape with five or more sides.

[4]
The method of any one of [1] to [3], wherein the chemical etching process includes providing a precious metal catalyst on the second region, and then putting the semiconductor substrate in contact with an etching liquid or an etching gas.

[5]
The method of [4], wherein the precious metal catalyst is provided on the second region by electroless plating.

[6]
The method of [4] or [5], wherein the precious metal catalyst is granular.

[7]
The method of any one of [4] to [6], wherein the chemical etching process includes putting the semiconductor substrate in contact with the etching liquid, and the etching liquid includes hydrofluoric acid and hydrogen peroxide.

[8]
The method of any one of [1] to [7], wherein the chemical etching process is performed such that each of the plurality of chip main bodies includes, on an end face thereof, stripe-shaped recesses or projections each extending from a surface of the chip main body, on which the protection film is formed, toward an opposite surface thereof.

[9]
The method of [8], wherein each of the recesses or the projections has a width of 10 to 100 nm.

[10]
The method of [8], wherein each of the recesses or the projections has a width of 10 to 50 nm.

[11]
The method of any one of [1] to [10], wherein each of the plurality of first regions includes a semiconductor element including an electrode pad.

[12]
The method of any one of [1] to [11], wherein the semiconductor substrate is a silicon substrate.

[13]
A semiconductor chip comprising:
a chip main body including a surface region which includes a semiconductor element,
wherein an end face of the chip main body has etching traces.

[14]
The semiconductor chip of [13], wherein the etching traces are stripe-shaped recesses or projections each extending from a surface of the chip main body on the surface region's side toward an opposite surface thereof.

[15]
The semiconductor chip of [14], wherein each of the recesses or projections has a width of 10 to 100 nm.

[16]
The semiconductor chip of [14], wherein each of the recesses or projections has a width of 10 to 50 nm.

[17]
The semiconductor chip of any one of [13] to [16], further comprising a protection film covering the surface region, wherein a contour of a surface of the chip main body on the surface region's side agrees, at least partly, with a contour of an orthogonal projection of the protection film onto a plane including the surface of the chip main body on the surface region's side.

[18]
The semiconductor chip of any one of [13] to [17], wherein a surface of the chip main body on the surface region's side does includes no corner portion which is defined by two line segments which are in contact at one end.

[19]
A semiconductor chip comprising:
a chip main body including a surface region which includes a semiconductor element; and
a protection film covering the surface region,
wherein the chip main body is singulated by forming on a semiconductor substrate an etching mask including the protection film and subjecting the semiconductor substrate to a chemical etching process using a precious metal catalyst and an etching liquid or an etching gas, and a contour of a surface of the chip main body on the surface region's side agrees, at least partly, with a contour of an orthogonal projection of the protection film onto a plane including the surface of the chip main body on the surface region's side.

[20]

A semiconductor chip comprising:

a chip main body including a surface region which includes a semiconductor element, wherein the chip main body is singulated by forming on a semiconductor substrate an etching mask including a protection film and subjecting the semiconductor substrate to a chemical etching process using a precious metal catalyst and an etching liquid or an etching gas, and a surface of the chip main body on the surface region's side includes no corner portion which is defined by two line segments which are in contact at one end.

[21]

A semiconductor device comprising:

a support member;

the semiconductor chip of any one of [13] to [20], which is located on the support member; and a mold resin provided on the support member in a manner to cover the semiconductor chip.

[22]

A semiconductor device comprising:

a support member;

the semiconductor chip of any one of [13] to [20], which is located on the support member; and a bonding member lying between the support member and the semiconductor chip.

What is claimed is:

1. A semiconductor chip comprising:
a chip main body including a surface region which includes a semiconductor element,
wherein an end face of the chip main body has stripe-shaped recesses or projections, each of the recesses extending from a surface of the chip main body on the surface region's side toward an opposite surface thereof and each of the projections each extending from a surface of the chip main body on the surface region's side toward an opposite surface thereof, and
each of the recesses or the projections has a width of 10 to 100 nm.

2. The semiconductor chip of claim 1, further comprising a protection film covering the surface region,
wherein a contour of a surface of the chip main body on the surface region's side agrees, at least partly, with a contour of an orthogonal projection of the protection film onto a plane including the surface of the chip main body on the surface region's side.

3. The semiconductor chip of claim 1, wherein a surface of the chip main body on the surface region's side includes no corner portion which is defined by two line segments which are in contact at one end.

4. The semiconductor chip of claim 1, wherein the semiconductor element includes a transistor.

5. The semiconductor chip of claim 1, wherein the semiconductor element includes a diode.

6. The semiconductor chip of claim 1, wherein the semiconductor element includes a light-emitting diode.

7. The semiconductor chip of claim 1, wherein the semiconductor element includes a semiconductor laser.

8. The semiconductor chip of claim 4, wherein the element region further includes a capacitor.

9. The semiconductor chip of claim 4, wherein the element region further includes a wiring.

* * * * *